(12) United States Patent
Litsyn et al.

(10) Patent No.: US 8,086,931 B2
(45) Date of Patent: Dec. 27, 2011

(54) METHOD AND DEVICE FOR MULTI PHASE ERROR-CORRECTION

(75) Inventors: Simon Litsyn, Giv'at Shmuel (IL); Eran Sharon, Rishon Lezion (IL); Idan Alrod, Herzliya (IL); Menahem Lasser, Kohav Yair (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 41 days.

(21) Appl. No.: 12/648,313

(22) Filed: Dec. 29, 2009

(65) Prior Publication Data

US 2010/0169737 A1    Jul. 1, 2010

Related U.S. Application Data

(62) Division of application No. 11/514,182, filed on Sep. 1, 2006, now Pat. No. 7,844,877.

(60) Provisional application No. 60/736,458, filed on Nov. 15, 2005.

(51) Int. Cl.
    *H03M 13/00* (2006.01)
(52) U.S. Cl. ............... 714/752; 714/755; 714/786
(58) Field of Classification Search ............. 714/752, 714/755, 785, 756, 786, 801
    See application file for complete search history.

(56) References Cited

U.S. PATENT DOCUMENTS

| | | | |
|---|---|---|---|
| 4,633,470 A | 12/1986 | Welch | |
| 4,736,376 A * | 4/1988 | Stiffler | 714/785 |
| 6,330,277 B1 | 12/2001 | Gelblum | |
| 6,430,722 B1 | 8/2002 | Eroz | |
| 6,487,693 B1 | 11/2002 | Kim | |
| 6,516,035 B1 | 2/2003 | Wang | |
| 6,526,531 B1 | 2/2003 | Wang | |
| 6,633,856 B2 | 10/2003 | Richardson et al. | |
| 6,731,696 B1 | 5/2004 | Gelblum et al. | |
| 6,842,491 B2 | 1/2005 | Gelblum | |
| 6,865,708 B2 | 3/2005 | Wang | |
| 7,356,752 B2 | 4/2008 | Hewitt | |
| 2002/0147954 A1 | 10/2002 | Shea | |
| 2004/0148560 A1 | 7/2004 | Hocevar | |
| 2005/0003756 A1 | 1/2005 | Sun et al. | |
| 2005/0091565 A1 | 4/2005 | Eroz et al. | |

(Continued)

FOREIGN PATENT DOCUMENTS

WO    WO2005022814    3/2005

OTHER PUBLICATIONS

Elwyn R. Berlekamp/Algebraic Coding Theory, Revised 1984 Edit.

(Continued)

*Primary Examiner* — Fritz Alphonse
(74) *Attorney, Agent, or Firm* — Mark M. Friedman

(57) ABSTRACT

Data bits to be encoded are split into a plurality of subgroups. Each subgroup is encoded separately to generate a corresponding codeword. Selected subsets are removed from the corresponding codewords, leaving behind shortened codewords, and are many-to-one transformed to condensed bits. The final codeword is a combination of the shortened codewords and the condensed bits. A representation of the final codeword is decoded by being partitioned to a selected subset and a plurality of remaining subsets. Each remaining subset is decoded separately. If one of the decodings fails, the remaining subset whose decoding failed is decoded at least in part according to the selected subset. If the encoding and decoding are systematic then the selected subsets are of parity bits.

26 Claims, 8 Drawing Sheets

U.S. PATENT DOCUMENTS

| | | |
|---|---|---|
| 2005/0091570 A1 | 4/2005 | Eroz et al. |
| 2005/0149815 A1 | 7/2005 | Eroz et al. |
| 2005/0160350 A1 | 7/2005 | Dror et al. |
| 2005/0193320 A1 | 9/2005 | Varnica et al. |
| 2005/0229087 A1 | 10/2005 | Kim et al. |

OTHER PUBLICATIONS

R. E. Blahut, Theory and Practice of Error-Correcting codes, Addison-Wesley, 1983.

W. G. Chambers, R.E. Peile, K.Y. Tsie, and N.Zein, An algorithm for solving the Welch-Berlekamp Key-equation with a simplified proof, Electronic Letters, vol. 29, 1993, pp. 1620-1621.

Nefedov N et al:"Performance of Low Complexity Concatenated Codes Formed by Differental Encoders" Proceedings of the International Conference on Telecommunicationsict, XX, XX, vol. 1. Jun. 23, pp. 151-155.

Barbulescu A S et al:"Rate compatible turbo codes" Electronics Letters, IEE Stevenage, GB, vol. 31, No. 7, Mar. 30, 1995, pp. 535-536.

Shannon "A Mathematical theory of communications" Bell System Telephone Journal, vol. 27, 1948, pt, I, pp. 379-424, pt II pp. 623-656.

M. G. Luby, M. Mitzenmacher, M. A. Shokrollahl and D.A. Spielman, "Improved low density parity-check codes using irregular graphs," IEEE Transactions on Information theory, vol. 47, No. 2, Feb. 2001.

R.G. Gallager, "Low-density parity-check codes," IRE Trans. Info. Theory, vol. IT-8, pp. 21-28, 1962.

V. Guruswami and M. Sudan, Improved decoding of Reed-Solomon and Algebraic-Geometry codes, IEEE Trans. Inform. Theory, 6, 1999, pp. 1757-1767.

D. Mandelbaum, Decoding of erasures and errors for certain RS codes by decreased redundancy, IEEE Trans. Inform. Theory, vol. 28, 2, 1982, pp. 330-336.

J.L. Massey, Shift-register synthesis and BCH decoding, IEEE Trans. Inform. Theory, vol. 15, 1969, pp. 122-127.

T.J. Richardson and R. Urbanke, "The capacity of low-density parity-check codes under message passing decoding,"IEEE Trans. Inform, Theory, vol. 7, pp. 599-618, 2001.

C. Berron, A. Glavieux, and P. Thitimajshima, "Near Shannon Limit error correcting coding and decoding: Turbo codes,", in IEEE Int. Conf. on Communications, 1993, pp. 1064-1070.

M.M Mansour and N.R. Shanbhag, "High-Throughput LDPC Decoders,"IEEE Trans. on Very Large Sccale Integration Systems, vol. 11, pp. 976-995, 2003.

T.J. Richardson, A. Shokrollahi and R. Urbanke, "Design of capacity approaching Irregular Low-Density Parity-Check Codes," IEEE Trans. Inform. Theory, vol. 47, No. 2, Feb. 2001, pp. 619-637.

E. Sharon, S. Litsyn, J. Goldberger "An Efficient Message—Passing Schedule for LDPC Decoding," in proc. 23rd IEEE Convention in Tel Aviv, Israel, pp. 223-226, Sep. 6-7, 2004.

R. M. Tanner, "A recursive approach to low complexity code" IEEE Trans. on Info. Theory, vol. 27 (5), pp. 533-547, 1981.

J. Zhang and M. Fossorier, "Scheduled belief propagation decoding," Department of Electrical Engineering University of Hawaii at Manoa Honolulu, HI 96816, USA, pp. 8-15, 2002.

W. Wesley Peterson, E.J. Weldon, Error-Correcting codes, second edition.

Oliver Pretzel, Error-Correcting codes and Finite Fields.

* cited by examiner

| Syndrome | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Error#1 Location | 0 | 8 | 9 | 9 | 10 | 10 | 10 | 11 | 11 | 11 | 11 | 10 | 11 | 9 | 8 | 6 |
| Error#2 Location | 0 | 0 | 0 | 8 | 0 | 8 | 9 | 6 | 0 | 8 | 9 | 6 | 10 | 6 | 6 | 0 |
| Syndrome | 16 | 17 | 18 | 19 | 20 | 24 | 26 | 30 | 31 | 32 | 33 | 34 | 36 | 38 | 40 | 45 |
| Error#1 Location | 12 | 12 | 12 | 14 | 12 | 12 | 15 | 13 | 12 | 13 | 13 | 13 | 13 | 14 | 13 | 15 |
| Error#2 Location | 0 | 8 | 9 | 4 | 10 | 11 | 1 | 2 | 6 | 0 | 8 | 9 | 10 | 5 | 11 | 3 |
| Syndrome | 46 | 47 | 48 | 49 | 53 | 54 | 55 | 58 | 60 | 62 | 63 | 64 | 65 | 66 | 67 | 68 |
| Error#1 Location | 12 | 13 | 13 | 6 | 5 | 11 | 3 | 10 | 9 | 2 | 8 | 14 | 14 | 14 | 12 | 14 |
| Error#2 Location | 2 | 6 | 12 | 2 | 4 | 2 | 1 | 2 | 2 | 0 | 2 | 0 | 8 | 9 | 4 | 10 |
| Syndrome | 70 | 72 | 76 | 79 | 80 | 81 | 82 | 83 | 86 | 87 | 88 | 91 | 92 | 96 | 97 | 98 |
| Error#1 Location | 13 | 14 | 15 | 14 | 14 | 9 | 8 | 4 | 7 | 10 | 5 | 11 | 6 | 14 | 7 | 10 |
| Error#2 Location | 5 | 11 | 7 | 6 | 12 | 4 | 4 | 0 | 1 | 4 | 2 | 4 | 4 | 13 | 3 | 5 |
| Syndrome | 100 | 102 | 103 | 105 | 109 | 110 | 115 | 118 | 126 | 128 | 129 | 130 | 132 | 136 | 138 | 140 |
| Error#1 Location | 9 | 5 | 8 | 6 | 4 | 11 | 13 | 12 | 14 | 15 | 15 | 15 | 15 | 15 | 12 | 14 |
| Error#2 Location | 5 | 0 | 5 | 5 | 2 | 5 | 4 | 5 | 2 | 0 | 8 | 9 | 10 | 11 | 1 | 7 |
| Syndrome | 141 | 143 | 144 | 146 | 147 | 149 | 152 | 154 | 155 | 158 | 159 | 160 | 162 | 164 | 165 | 169 |
| Error#1 Location | 13 | 15 | 15 | 11 | 3 | 6 | 9 | 1 | 8 | 10 | 7 | 15 | 6 | 2 | 11 | 10 |
| Error#2 Location | 3 | 6 | 12 | 1 | 2 | 1 | 1 | 0 | 1 | 1 | 4 | 13 | 3 | 1 | 3 | 3 |
| Syndrome | 170 | 172 | 173 | 175 | 186 | 189 | 190 | 192 | 195 | 196 | 200 | 201 | 203 | 204 | 205 | 206 |
| Error#1 Location | 7 | 8 | 3 | 9 | 13 | 12 | 15 | 15 | 7 | 11 | 10 | 4 | 5 | 7 | 8 | 9 |
| Error#2 Location | 5 | 3 | 0 | 3 | 1 | 3 | 2 | 14 | 6 | 7 | 7 | 1 | 3 | 0 | 7 | 7 |
| Syndrome | 211 | 218 | 220 | 230 | 236 | 237 | 242 | 252 | 254 | 0 | 0 | 0 | 0 | 0 | 0 | 0 |
| Error#1 Location | 15 | 14 | 12 | 15 | 13 | 14 | 7 | 5 | 4 | 0 | 0 | 0 | 0 | 0 | 0 | 0 |
| Error#2 Location | 4 | 1 | 7 | 5 | 7 | 3 | 2 | 1 | 3 | 0 | 0 | 0 | 0 | 0 | 0 | 0 |

METHOD AND DEVICE FOR MULTI PHASE ERROR-CORRECTION

CROSS-REFERENCE TO RELATED APPLICATIONS

This patent application is a Divisional of U.S. patent application Ser. No. 11/514,182 filed Sep. 1, 2006, now U.S. Pat. No. 7,844,877, which claims the benefit of U.S. Provisional Patent Application Ser. No. 60/736,458, filed Nov. 15, 2005.

FIELD OF THE INVENTION

The present invention relates generally to an encoding and decoding scheme. More particularly, the present invention relates to a method and device providing error-correction of a code by encoding and decoding a shorter sub-code.

BACKGROUND OF THE INVENTION

In the modern information age binary values, e.g. ones and zeros, are used to represent and communicate various types of information, e.g. memory, video, audio, statistical information, etc. Unfortunately, during storage, transmission, and/or processing of binary data, errors may be unintentionally introduced (e.g. a '1' bit may be changed to a '0' bit or vice versa).

Several techniques known in the art for overcoming the existence of such errors employ an error correction coding scheme to ensure the reliability of the stored information. The physics of storage methods exhibit a fixed capacity that can be expressed in terms of information bits per storage cell nucleus. This fixed capacity is a direct outcome of the Signal to Noise Ratio (SNR) in each storage nucleus cell, thus defining a theoretical upper limit (known as the "Shannon limit").

In many cases, such error correction coding scheme require the use of a very long code in order to approach the theoretical correction capability for a given code rate.

However, increasing the code length leads to a complexity and area increase of the encoder and decoder circuitry. The result is that at some point it is no longer practical or efficient to implement an integrated circuit comprising such error correction coding scheme. Alternatively, there exists insufficient silicon density to support standard decoding techniques.

The term "error correction" (i.e. the detection and correction of errors) is applied herein to data storage. Encoding and decoding, according to forward error-correcting codes, are carried out either in software or with hardware.

Once the Shannon limit [1] was discovered, there was a need to provide codes that come close to the performance limits of Shannon's information theorem. It is well known [2]-[5] that in order to approach these limits one must increase the code length. In 1993, Berron [6] was the first to present near capacity approaching techniques using iterative decoding. However, only long codes were considered. Later on [7]-[11] with the introduction of Low Density Parity Check (LDPC) codes, new structures that came even closer to these capacity limits were successfully presented, again only for long codes, typically about $10^7$ bits long.

Specific schemes based on LDPC iterative decoders are depicted in [12]-[14], where a high emphasis is made to reduce the implementation complexity of the computation units, the number of iterations, the required memory size, etc.

In order to implement these long codes in a complexity restricted environment and benefit from their performance, there is thus a need for providing a method to reduce the circuitry complexity of the encoder and decoder of long codes such that practical shorter schemes could be employed.

A prior art technique disclosing a puncturing method for reducing the circuitry complexity of the encoder and decoder by reducing the parity overhead is taught by US Patent Application No. 20050160350 to Dror et al.

The Dror patent discloses a high-speed data encoder/decoder providing a single-bit forward error-correction. The data is arranged to be protected within a rectangular array, such that the location of a single bit error is determined according to row and column positions. As a result, the size of lookup tables provided for converting error syndromes to error locations is reduced.

However, each of the two computation phases disclosed in the Dror patent is not by itself an error correction scheme as it does not provide enough information for correcting a single error in the first phase. Therefore, the first phase cannot correct even a single error in each sub-code without depending on computations obtained at the second phase.

SUMMARY OF THE INVENTION

According to the present invention there is provided a method of decoding a representation of a code word, the method including the steps of: (a) generating a plurality of sub-words from the representation of the code word, such that bits of each sub-word are a proper subset of bits of the representation of the code word; (b) decoding each sub-word solely according to its own bits to generate a corresponding decoded sub-word; and (c) if the decoding of one of the sub-words fails: modifying the decoded sub-word that corresponds to the one sub-word whose decoding failed, thereby producing a modified decoded sub-word, the modifying being at least in part according to the corresponding decoded sub-word of at least one successfully-decoded sub-word.

According to the present invention there is provided an apparatus for decoding a word of M bits, including: (a) a decoder for decoding a word of N<M bits; and (b) a mechanism for applying the decoder separately to each of a different subset of N bits selected from the word of M bits, each application of the decoder depending solely on the N bits to which each application is applied, each application generating corresponding decoded data, such that final decoded data of the word of M bits are generated at least in part according to the corresponding decoded data of the applications, wherein: if one of the applications fails, then the mechanism effects a modification of the corresponding decoded data of the failed application, at least in part, according to the corresponding decoded data of at least one successful application.

According to the present invention there is provided an apparatus for decoding a word of M bits, including: (a) a plurality of decoders each decoding a word of N<M bits; and (b) a mechanism for applying each of the plurality of decoders separately to each of a different subset of N bits selected from the word of M bits, each application of each of the plurality of decoders depending solely on the N bits to which each application is applied, each application generating corresponding decoded data, such that final decoded data of the word of M bits are generated at least in part according to the corresponding decoded data of the applications, wherein: if one of the decoders fails, then the mechanism effects a modification of the corresponding decoded data of the decoder that failed, at least in part, according to the corresponding decoded data of, at least one decoder that succeeded.

According to the present invention there is provided a method of providing a scheme for error correction of data bits, the method including the steps of: (a) encoding the data bits according to a first encoding scheme to generate a first group of parity bits; (b) encoding the data bits according to a second encoding scheme to generate a second group of parity bits; (c) transforming the second group of parity bits into a condensed group of parity bits, wherein the transforming is many-to-one; and (d) generating a final group of parity bits for the data bits by combining the first group of parity bits with the condensed group of parity bits.

According to the present invention there is provided a method of providing a scheme for error correction of data bits, the method including the steps of: (a) creating a plurality of sub-groups of bits from the data bits, such that each data bit appears at least once in the plurality of sub-groups; (b) encoding each sub-group of the plurality of sub-groups according to a corresponding first encoding scheme to generate, for each subgroup, a corresponding at least one first parity bit; (c) encoding each sub-group according to a corresponding second encoding scheme to generate, for each sub-group, a corresponding at least one second parity bit; (d) transforming all of the at least one second parity bit of all of the plurality of sub-groups into joint condensed parity bits, wherein the transforming is many-to-one; and (e) generating a final group of parity bits for the data bits by combining all of the at least one first parity bit of all of the plurality of sub-groups with the joint condensed parity bits.

According to the present invention there is provided a method of providing a scheme for error correction of data bits, the method including the steps of: (a) creating a plurality of sub-groups of bits from the data bits, such that each data bit appears at least once in the plurality of sub-groups; (b) encoding each sub-group of the plurality of sub-groups using a corresponding encoding scheme to generate, for each sub-group, a corresponding at least one parity bit; (c) for each sub-group, selecting a corresponding selected subset from among the bits of the each sub-group and the corresponding at least one parity bit of each sub-group; (d) transforming the selected subsets of all of the plurality of sub-groups into joint condensed selected bits, wherein the transforming is many-to-one; (e) generating a corresponding shortened code word for each sub-group by combining the bits of each sub-group with the corresponding at least one parity bit of each sub-group, and then removing bits of the corresponding selected subset of each sub-group; and (f) generating a code word for the data bits by combining the corresponding shortened code word of all of the plurality of sub-groups with the joint condensed selected bits.

According to the present invention there is provided a method of providing a scheme for error correction of data bits, the method including the steps of: (a) creating a plurality of sub-groups of bits from the data bits, such that each data bit appears at least once in the sub-groups; (b) encoding each of the plurality of sub-groups using a corresponding encoding scheme to generate, for each sub-group, a corresponding code word; (c) for each sub-group, selecting a corresponding selected subset from bits of the corresponding code word; (d) transforming the corresponding selected subsets of all of the corresponding code words into joint condensed selected bits, wherein the transforming is many-to-one; (e) generating a corresponding shortened code word for each of the corresponding code words by removing bits of the selected subset corresponding to each corresponding code word; and (f) generating a code word for the data bits by combining the corresponding shortened code word of all of the plurality of sub-groups with the joint condensed selected bits.

According to the present invention there is provided a method of decoding a representation of a code word, the representation containing M data bits and P parity bits, the method including the steps of: a) partitioning the P parity bits into a first group of parity bits and a second group of parity bits; b) decoding the M data bits using only the first group of parity bits to provide corrected data bits; and c) if the decoding using only the first group of parity bits fails, then decoding the M data bits using the first group of parity bits and the second group of parity bits to provide the corrected data bits.

According to the present invention there is provided a method of decoding a representation of a code word containing M data bits and P parity bits, the method including the steps of: a) partitioning the M data bits into K>1 subsets, wherein each of the M data bits appears at least once in the K subsets; b) partitioning the P parity bits into a first group of parity bits and a second group of parity bits; c) partitioning the first group of parity bits into K subsets each subset of the first group of parity bits corresponding to a respective subset of the M data bits; d) decoding each subset of the M data bits according to the corresponding subset of the first group of parity bits to generate decoded data of the each subset of the M data bits; e) if the decoding of one of the K subsets of the M data bits fails: decoding the one subset according to, at least in part, the second group of parity bits to generate the decoded data of the one subset; and f) combining the decoded data of all of the K subsets of the M data bits to generate total decoded data for the M data bits.

According to the present invention there is provided a method of decoding M data bits out of a representation of a code word, that has N>M bits, the method including the steps of: a) removing a selected subset of at most N−M bits from the N bits, thereby producing a set of remaining bits; b) partitioning the remaining bits into K>1 subsets of the remaining bits, wherein each of the remaining bits is a member of at least one of the K subsets; c) decoding each of the K subsets according only to bits of the each subset to generate decoded data of the each subset; d) if the decoding of one of the K subsets fails: decoding the one subset, at least in part, according to the removed selected subset to generate the decoded data of the one subset; and e) combining the decoded data of all of the K subsets to generate total decoded data for the M data bits.

A first aspect of the present invention is a method of decoding a representation of a code word. In this aspect of the present invention and in other, similar aspects of the present invention, it is a representation of a code word that is decoded, not a code word as written to storage, because writing and then reading the code word may introduce errors to the code word. A plurality of sub-words are generated from the representation of the code word, such that bits of each sub-word are a proper subset of bits of the representation of the code word. Each sub-word is decoded solely according to its own bits to generate a corresponding decoded sub-word. If the decoding of one of the sub-words fails, then the decoded sub-word, that corresponds to the sub-word whose decoding has failed, is modified, thereby producing a modified decoded sub-word. The modifying is at least in part according to the decoded sub-word(s) that correspond to one or more of the successfully-decoded sub-word.

As noted below, the scope of the term "decoded sub-word" includes both a numerical value obtained by successfully decoding a sub-word and a logical indication that the attempt to decode the sub-word failed. Note that the numerical value obtained by successfully decoding a sub-word is a portion of the original codeword itself, and not just a representation thereof. In other words, a "successfully-decoded sub-word" is a sub-code-word. "Modifying" a decoded sub-word means changing a decoded sub-word from one numerical value to another or from a logical indication of decoding failure to a numerical value or from a numerical value to a logical indication of failure.

For example, in example case 1 below, the two sub-words $\tilde{C}_1^{short}$ and $\tilde{C}_2^{short}$ are generated from the representation of the code word. Each sub-word is decoded separately using an [11,7,3] decoder. If the decoding of $\tilde{C}_1^{short}$ fails but the decoding of $\tilde{C}_2^{short}$ succeeds, then the logical indication that the attempt to decode $\tilde{C}_1^{short}$ failed is modified by replacing that logical indication with $C_1$ as decoded from $\tilde{C}_1$. That modifying is according to the sub-code-word $C_2^{short}$ that corresponds to the successfully-decoded $\tilde{C}_2^{short}$: $\tilde{C}_2^{short}$ is encoded using a [15,7,5] encoder to regenerate $P_2$, $P_2$ is XORed with $\tilde{P}$ to make $\tilde{P}$, $\tilde{C}_1^{short}$, and $\tilde{P}_1$ are concatenated to make $\tilde{C}_1$.

Preferably, if the decoding of one of the sub-words fails, then data from the modified decoded sub-word are combined with data from all the decoded sub-words that correspond to the successfully-decoded sub-words. For example, in example case 1 below, if the decoding of $\tilde{C}_1^{short}$ fails but the decoding of $\tilde{C}_2^{short}$ succeeds, then the first seven bits of $C_1$ as decoded from $\tilde{C}_1$ are concatenated with the first seven bits of $C_2^{short}$ to recover the header.

Most preferably, the combining of the data from the modified decoded sub-word with the data from all the decoded sub-words that correspond to the successfully-decoded sub-words is affected by steps including assembling the data from the modified decoded sub-word with the data from all the decoded sub-words that correspond to the successfully-decoded sub-words. "Assembling" data from two or more different sources is defined herein as bringing together, into a register or a storage location, bits from all the sources, possibly with the order of the bits being permuted, and possibly with one or more of the bits being repeated at least once. Typically, however, as in example case 1 below, the data are "assembled" by just concatenating bits from the various sources of the data, without permuting the order of the bits and without repeating bits.

Preferably, the sub-words are disjoint. For example, in example case 1 below, $\tilde{C}_1^{short}$ and $\tilde{C}_2^{short}$ are disjoint.

Preferably, the sub-words all contain identical numbers of bits. For example, in example case 1 below, $\tilde{C}_1^{short}$ and $\tilde{C}_2^{short}$ both contain 11 bits.

A second aspect of the present invention is an apparatus for decoding a word of M bits. The apparatus includes a decoder for decoding a word of N<M bits and a mechanism for applying the decoder separately to each of a different subset of N bits selected from the word of M bits. Each application of the decoder depends solely on the N bits to which that application is applied. Each application of the decoder generates corresponding decoded data, such that the final decoded data are generated at least in part according to the decoded data produced by the applications of the decoder. If one of the applications of the decoder fails, then the decoded data of that application are modified at least in part according to the decoded data produced by the other applications of the decoder.

For example, in example case 1 below, M=26, N=11 and the decoder is the [11,7,3] decoder. The 11-bit subsets are $\tilde{C}_1^{short}$ and $\tilde{C}_2^{short}$. The [11,7,3] decoder is applied separately to these two subsets. The final decoded data are the decoded 14-bit header. If the decoding of $\tilde{C}_1^{short}$ fails but the decoding of $\tilde{C}_2^{short}$ succeeds, then the logical indication that the attempt to decode $\tilde{C}_1^{short}$ failed is modified by replacing that logical indicator with $C_1$ as decoded from $\tilde{C}_1$. That modifying is according to the decoded sub-word $C_2^{short}$ that corresponds to the successfully-decoded $\tilde{C}_2^{short}$: $C_2^{short}$ is encoded using a [15,7,5] encoder to regenerate $P_2$, $P_2$ is XORed with $\tilde{P}$ to make $\tilde{P}_1$, $\tilde{C}_1^{short}$ and $\tilde{P}_1$ are concatenated to make $\tilde{C}_1$.

Preferably, the subsets are disjoint. For example, in example case 1 below, $\tilde{C}_1^{short}$ and $\tilde{C}_2^{short}$ are disjoint.

A third aspect of the present invention is an apparatus for decoding a word of M bits. The apparatus includes a plurality of decoders, each one of which decodes a word of N<M bits. The apparatus also includes a mechanism for applying each decoder separately to a different subset of N bits selected from the word of M bits. Each application of a decoder depends solely on the N bits to which the decoder is being applied. Each application of a decoder generates corresponding decoded data, such that the final decoded data of the word of M bits are generated at least in part according to the decoded data produced by applying the decoders. If one of the decoders fails, then the corresponding decoded data are modified at least in part according to the decoded data produced by the other decoders.

For example, in example case 1 below, M=26, N=11 and the decoders are [11,7,3] decoders. The 11-bit subsets are $\tilde{C}_1^{short}$ and $\tilde{C}_2^{short}$. Each [11,7,3] decoder is applied to one of the two subsets. The final decoded data are the decoded 14-bit header. If the decoding of $\tilde{C}_1^{short}$ fails but the decoding of $\tilde{C}_2^{short}$ succeeds, then the logical indication that the attempt to decode $\tilde{C}_1^{short}$ failed is modified by replacing that logical indication with $C_1$ as decoded from $\tilde{C}_1$. That modifying is according to the decoded sub-word $C_2^{short}$ that corresponds to the successfully-decoded $\tilde{C}_2^{short}$: $C_2^{short}$ is encoded using a [15,7,5] encoder to regenerate $P_2$, $P_2$ is XORed with $\tilde{P}$ to make $\tilde{P}_1$, $\tilde{C}_1^{short}$ and $\tilde{P}_1$ are concatenated to make $\tilde{C}_1$.

Preferably, the subsets are disjoint. For example, in example case 1 below, $\tilde{C}_1^{short}$ and $\tilde{C}_2^{short}$ are disjoint.

A fourth aspect of the present invention is a method of providing a scheme for error correction of data bits. The data bits are encoded according to a first encoding scheme to generate a first group of parity bits. The data bits also are encoded according to a second encoding scheme to generate a second group of parity bits. The second group of parity bits is transformed into a condensed group of parity bits by a many-to-one transformation. A final group of parity bits is generated by combining the first and second groups of parity bits.

For example, in example case 1 below, the data bits are the 14 bits of the header. The first encoding scheme is an [11,7,3] scheme that produces $C_1^{short}$ and $C_2^{short}$. The first group of parity bits is the last four bits of each of $C_1^{short}$ and $C_2^{short}$. The second encoding scheme is a [15,7,5] scheme that generates the second group of parity bits, $P_1$ and $P_2$. The second group of parity bits is transformed to the condensed group P by the many-to-one transformation "XOR" (8 bits in, 4 bits out). The final group of parity bits is generated by combining the last four bits of $C_1^{short}$ and the last four bits of $C_2^{short}$ with P to provide the parity bits of the code word indicated in FIG. 8 by reference numerals 246 and 254.

Preferably, the first group of parity bits is combined with the condensed group of parity bits by assembling at least a portion of the first group of parity bits with the condensed group of parity bits. For example, in example case 1 below, $C_1^{short}$, $C_2^{short}$ and P are written together to a common location in the FLASH device, so that the last four bits of $C_1^{short}$, the last four bits of $C_2^{short}$ and P are stored together in the common location.

Preferably, the transforming step includes XORing a plurality of sub-groups of the second group of parity bits. For example, in example case 1 below, $P_1$ and $P_2$ are XORed.

A fifth aspect of the present invention is a method of providing a scheme for error correction of data bits. A plurality of sub-groups of bits are created from the data bits, such that each data bit appears at least once in the sub-groups. Each sub-group is encoded according to a corresponding first encoding scheme to generate one or more corresponding first parity bits. Each sub-group is encoded according to a corresponding second encoding scheme to generate one or more corresponding second parity bits. All the second parity bits are transformed into joint condensed parity bits by a many-to-one operation. A final group of parity bits is generated by combining all the first parity bits with the joint condensed parity bits.

For example, in example case 1 below, the data bits are the 14 bits of the header. The two sub-groups are the first 7 bits of the header and the last 7 bits of the header. Each data bit appears exactly once in one of the sub-groups and not at all in the other sub-group. The first encoding schemes all are [11,7,3] schemes that produce $C_1^{short}$ and $C_2^{short}$, thereby generating four parity bits (the last four bits of $C_1^{short}$) for the first sub-group and four parity bits (the last four bits of $C_2^{short}$) for the second sub-group. The second encoding schemes all are [15,7,5] schemes that generate four parity bits $P_1$ for the first sub-group and four parity bits $P_2$ for the second sub-group. $P_1$ and $P_2$ are transformed to the condensed group P by the many-to-one "XOR" operation (8 bits in, 4 bits out). The final group of parity bits is generated by combining the last four bits of $C_1^{short}$ and the last four bits of $C_2^{short}$ with P by writing $C_1^{short}$, $C_2^{short}$ and P to the FLASH device.

Preferably, the first parity bits are combined with the condensed group of parity bits by assembling all the first parity bits with the condensed group of parity bits. For example, in example case 1 below, $C_1^{short}$, $C_2^{short}$ and P are written together to the FLASH device, so that the last four bits of $C_1^{short}$, the last four bits of $C_2^{short}$ and P are stored together in the common location.

Preferably, each data bit appears only once in the plurality of sub-groups. For example, in example case 1 below, each of the first 7 bits of the header appears once in the first sub-group and not at all in the second sub-group, and each of the last 7 bits of the header appears once in the second sub-group and not at all in the first sub-group. Alternatively, at least one data bit appears at least twice in the plurality of sub-groups. For example, in example case 2 below, there are 586×7=4102 data bits in the 586 code words, for encoding 4096 information bits, so that e.g. one of the information bits can be duplicated six times.

Preferably, all the sub-groups are of equal size. For example, in example case 1 below, both sub-groups have 7 bits each.

Preferably, for at least one of the sub-groups, the corresponding first and second encoding schemes are obtained using a common encoding method, such that the first encoding scheme(s) encode(s) bits of the sub-group(s) according to a first order and the second encoding scheme(s) encode(s) bits of the sub-group(s) according to a second order. For example, as an alternative to example case 1 below, [11,7,3] encoding can be applied separately, as a first encoding scheme, to the first and last 7 bits of the header; then the order of the first 7 bits of header can be permuted and the order of the last 7 bits of the header can be permuted; and then [11,7,3] encoding can be applied separately, as a second encoding scheme, to the permuted first and last 7 bits of the header. The condensed parity bits would be produced by XORing the last four bits of the codeword produced by encoding the permuted first 7 header bits with the last four bits of the codeword produced by encoding the permuted last 7 header bits. As in example case 1 below, 14 data bits and 12 parity bits would be stored.

Preferably, all the sub-groups are encoded according to a common first encoding scheme. For example, in example case 1 below, the common first encoding scheme is an [11,7,3] encoding scheme.

Preferably, all the sub-groups are encoded according to a common second encoding scheme. For example, in example case 1 below, the common second encoding scheme is a [15,7,5] encoding scheme.

Preferably, the transforming of the second parity bits to joint condensed parity bits includes XORing at least one second parity bit that corresponds to one of the sub-groups with at least one second parity bit that corresponds to another of the sub-groups. For example, in example case 1 below, the two groups of "second parity bits" are $P_1$ and $P_2$, while $P_1$ is XORed with $P_2$.

A sixth aspect of the present invention is a method of providing a scheme for error correction for data bits. A plurality of sub-groups of bits are created from the data bits, such that each data bit appears at least once in the sub-groups. Each sub-group is encoded according to a corresponding encoding scheme to generate one or more corresponding first parity bits. For each sub-group, a corresponding selected subset is selected from among the bits of the sub-group and the corresponding parity bit(s). All the selected subsets are transformed into joint condensed selected bits by a many-to-one operation. For each sub-group, a corresponding shortened codeword is generated by combining the bits of each sub-group with the corresponding parity bit(s) and then removing bits of the corresponding selected subset. Finally, a codeword for the data bits is generated by combining all the shortened codewords with the joint condensed selected bits.

For example, in example case 1 below, the data bits are the 14 bits of the header. The two sub-groups are the first 7 bits of the header and the last 7 bits of the header. Each data bit appears exactly once in one of the sub-groups and not at all in the other sub-group. Each sub-group is encoded using a [15,7,5] encoder to generate the codewords $C_1$ and $C_2$, each of which includes 8 parity bits. From the bits of $C_1$ and $C_2$, the "selected" subsets $P_1$ and $P_2$ are transformed to the joint condensed selected bits of P by the many-to-one operation "XOR" (8 bits in, 4 bits out). The shortened codewords $C_1^{short}$ and $C_2^{short}$ are generated by combining the bits of the sub-groups with the parity bits that were produced by the [15,7,5] encoder to produce the full codewords $C_1$ and $C_2$ and then removing the selected subset $P_1$ from $C_1$ and removing the selected subset $P_2$ from $C_2$. The final codeword is generated by combining $C_1^{short}$ and $C_2^{short}$ with P by writing $C_1^{short}$, $C_2^{short}$ and P to the FLASH device.

Preferably, the bits of each subgroup are combined with the corresponding parity bit(s) by assembling the bits of the sub-group with the corresponding parity bit(s). For example, in example case 1 below, the codeword $C_1$ is produced by concatenating the first sub-group with the parity bits produced by encoding the first sub-group and the codeword $C_2$ is produced by concatenating the second sub-group with the parity bits produced by encoding the second sub-group.

Preferably, the shortened codewords are combined with the joint selected condensed bits by assembling all the shortened codewords with the joint selected condensed bits. For example, in example case 1 below, $C_1^{short}$, $C_2^{short}$ and P are stored together in a common location in the FLASH device.

Preferably, each data bit appears only once in the plurality of sub-groups. For example, in example case 1 below, each of the first 7 bits of the header appears once in the first sub-group and not at all in the second sub-group, and each of the last 7 bits of the header appears once in the second sub-group and not at all in the first sub-group. Alternatively, at least one data bit appears at least twice in the plurality of sub-groups. For example, in example case 2 below, there are 586×7=4102 data bits in the 586 code words, for encoding 4096 information bits, so that e.g. one of the information bits can be duplicated six times.

Preferably, all the sub-groups are of equal size. For example, in example case 1 below, both sub-groups have 7 bits each.

Preferably, all the sub-groups are encoded according to a common encoding scheme. For example, in example case 1 below, the common encoding scheme is a [15,7,5] encoding scheme.

Preferably, the transforming of the selected subsets into joint condensed selected bits includes XORing the bits of one selected subset with the bits of another selected subset. For example, in example case 1 below, $P_1$ and $P_2$ are XORed.

A seventh aspect of the present invention is a method of providing error correction of data bits. A plurality of sub-groups of bits are created from the data bits, such that each data bit appears at least once in the sub-groups. Each sub-group is encoded, using a corresponding encoding scheme, to generate a corresponding codeword. From each codeword, a corresponding "selected subset" of bits is selected. All the selected subsets are transformed into joint condensed selected bits by a many-to-one transformation. A corresponding shortened codeword is generated for each codeword by removing bits of the corresponding selected subset from the codeword. A code word for the data bits as a whole is generated by combining all the shortened codewords with the joint condensed selected bits. Note that because the seventh aspect of the present invention does not need to use parity bits that are separate and distinguishable from the data bits, this aspect of the present invention is applicable to both systematic encoding and nonsystematic encoding.

For example, in example case 1 below, the data bits are the 14 bits of the header. The two sub-groups are the first 7 bits of the header and the last 7 bits of the header. Each data bit appears exactly once in one of the sub-groups and not at all in the other sub-group. The sub-groups are encoded using corresponding [15,7,5] encoding schemes to generate corresponding codewords $C_1$ and $C_2$. The selected subset $P_1$ is selected from the bits of $C_1$ and the selected subset $P_2$ is selected from the bits of $C_2$. $P_1$ and $P_2$ are transformed to P by a many-to-one "XOR" operation (8 bits in, 4 bits out). The shortened codewords $C_1^{short}$ and $C_2^{short}$ are generated by removing $P_1$ from $C_1$ and $P_2$ from $C_2$. The code word for the data bits as a whole is generated by combining $C_1^{short}$ and $C_2^{short}$ with P by writing $C_1^{short}$, $C_2^{short}$ and P to the FLASH device.

Preferably, the shortened codewords are combined with the joint selected condensed bits by assembling all the shortened codewords with the joint selected condensed bits. For example, in example case 1 below, $C_1^{short}$, $C_2^{short}$ and P are stored together in a common location in the FLASH device.

Preferably, each data bit appears only once in the plurality of sub-groups. For example, in example case 1 below, each of the first 7 bits of the header appears once in the first sub-group and not at all in the second sub-group, and each of the last 7 bits of the header appears once in the second sub-group and not at all in the first sub-group. Alternatively, at least one data bit appears at least twice in the plurality of sub-groups.

Preferably, all the sub-groups are of equal size. For example, in example case 1 below, both sub-groups have 7 bits each.

Preferably, all the sub-groups are encoded according to a common encoding scheme. For example, in example case 1 below, the common encoding scheme is the [15,7,5] encoding scheme.

Preferably, the transforming of the selected subsets into joint condensed selected bits includes XORing the bits of one selected subset with the bits of another selected subset. For example, in example case 1 below, $P_1$ and $P_2$ are XORed.

An eighth aspect of the present invention is a method of decoding a representation, of a code word, that contains M data bits and P parity bits. The P parity bits are partitioned into a first group of parity bits and a second group of parity bits. The M data bits are decoded using only the first group of parity bits to provide corrected data bits. If decoding using only the first group of parity bits fails, then the M data bits are decoded using both groups of parity bits to provide the corrected data bits.

For example, in example case 1 below, M=14 and P=12. The 14 data bits are the first 7 bits $\tilde{C}_1^{short}$ of $\tilde{C}_1^{short}$ and the first 7 bits of $\tilde{C}_2^{short}$. The 12 parity bits are the last 4 bits of, the last 4 bits of $\tilde{C}_2^{short}$, and $\tilde{P}$. The first group of parity bits is the last 4 bits of $\tilde{C}_1^{short}$ and the last 4 bits of $\tilde{C}_2^{short}$. The second group of parity bits is $\tilde{P}$. The data bits are decoded using an [11,7,3] decoder with only the first group of parity bits to provide decoded representations of the first 7 bits of $C_1^{short}$ and the first 7 bits of $C_2^{short}$. If the decoding of $\tilde{C}_1^{short}$ fails but the decoding of $\tilde{C}_2^{short}$ succeeds, then the decoded $C_2^{short}$ is encoded using a [15,7,5] encoder to regenerate $P_2$, $P_2$ is XORed with $\tilde{P}$ to make $\tilde{P}_1$, $\tilde{C}_1^{short}$ and $\tilde{P}_1$ are concatenated to make $\tilde{C}_1$, and $\tilde{C}_1$ is decoded using a [15,7,5] decoder.

A ninth aspect of the present invention is a method of decoding a representation, of a code word, that contains M data bits and P parity bits. The M data bits are partitioned into two or more subsets, such that each data bit appears at least once in the subsets. The P parity bits are partitioned into a first group of parity bits and a second group of parity bits. The first group of parity bits is further partitioned into the same number of subsets as the data bits were partitioned into, with a 1:1 correspondence between data bit subsets and first group parity bit subsets. Each data bit subset is decoded according to its corresponding first parity bit subset to generate corresponding decoded data. If one of these decodings fails, then the data bit subset whose decoding failed is decoded again at least in part according to the second group of parity bits to generate the corresponding decoded data. Finally, the decoded data of all the data bit subsets are combined to generate total decoded data for the M data bits.

For example, in example case 1 below, M=14 and P=12. The 14 data bits are partitioned into two subsets: the first 7 bits of $\tilde{C}_1^{short}$ and the first 7 bits of $\tilde{C}_2^{short}$. The first group of parity bits is the last 4 bits of $\tilde{C}_1^{short}$ and the last 4 bits of $\tilde{C}_2^{short}$. The second group of parity bits is $\tilde{P}$. The subset of the first parity bits that corresponds to the first 7 bits of $\tilde{C}_1^{short}$ is the last 4 bits of $\tilde{C}_1^{short}$. The subset of the first parity bits that corresponds to the first 7 bits of $\tilde{C}_2^{short}$ is the last 4 bits of $\tilde{C}_2^{short}$. The first 7 bits of $\tilde{C}_1^{short}$ are decoded by an [11,7,3] decoder using only the last 4 bits of $\tilde{C}_1^{short}$. The first 7 bits of $\tilde{C}_2^{short}$ are decoded by an [11,7,3] decoder using only the last 4 bits of $\tilde{C}_2^{short}$. If the decoding of $\tilde{C}_1^{short}$ fails but the decoding of $\tilde{C}_2^{short}$ succeeds, then the decoded $C_2^{short}$ is encoded using a [15,7,5] encoder to regenerate $P_2$, $P_2$ is XORed with $\tilde{P}$ to make $\tilde{P}_1$, $\tilde{C}_1^{short}$ and $\tilde{P}_1$ are concatenated to make $\tilde{C}_1$, and $\tilde{C}_1$ is decoded using a [15,7,5] decoder, thereby recreating the code word $C_1$. The first 7 bits of the recreated $C_1$ and the first 7 bits of the decoded $C_2^{short}$ are concatenated to generate the decoded 14-bit header.

Preferably, the decoded data of the data bit subsets are combined by assembling the decoded data of the data bit subsets. For example, in example case 1 below, the first 7 bits of the decoded $C_1^{short}$ and the first 7 bits of the decoded $C_2^{short}$ are concatenated to generate the decoded 14-bit header.

Preferably, the data bit subsets are disjoint. For example, in example case 1 below, the first 7 bits of $\tilde{C}_1^{short}$ and the first 7 bits of $\tilde{C}_2^{short}$ are two disjoint subsets.

Preferably, all the data bit subsets are of equal size. For example, in example case 1 below, all the data bit subsets include 7 bits.

Preferably, each data bit subset is decoded according to the corresponding first parity bit subset using a corresponding first decoding scheme; and the decoding, according to the second group of parity bits, of the data bit subset whose decoding by the first decoding scheme failed, includes using a corresponding second decoding scheme. For example, in example case 1 below, the first decoding schemes are [11,7,3] schemes and the second decoding scheme is the [15,7,5] scheme.

Preferably, for at least one of the data bit subsets, the corresponding first and second decoding schemes apply a common decoding method. For example, continuing the alternative to example case 1 of the fifth aspect of the present invention, both the first decoding scheme and the second decoding scheme are [11,7,3] schemes. The first decoding schemes use the stored parity bits that were generated by the encoding of the unpermuted header bits. If the decoding of the first 7 stored data bits fails but the decoding of the last 7 stored data bits succeeds, then the successfully decoded data bits are permuted and encoded to regenerate the corresponding parity bits. These regenerated parity bits are XORed with the last 4 stored parity bits to regenerate the parity bits of the first 7 permuted header bits, which are used in a second attempt to decode the first 7 stored data bits by performing a [11,7,3] decoding of permuted first 7 stored data bits.

Preferably, all the first decoding schemes are identical. For example, in example case 1 below, all the first decoding schemes are the same [11,7,3] scheme.

Preferably, all the second decoding schemes are identical. For example, in example case 1 below, all the second decoding schemes are the same [15,7,5] scheme.

A tenth aspect of the present invention is a method of decoding M data bits out of a representation, of a code word, that has N>M bits. A selected subset of at most N−M bits is removed from the N bits, thereby producing a set of remaining bits. The remaining bits are partitioned into two or more subsets, such that each remaining bit is a member of at least one of the subsets. Each remaining bit subset is decoded according only to its own bits to generate corresponding decoded data. If the decoding of one of the remaining bit subsets fails, that remaining bit subset is decoded at least in part according to the removed selected subset to generate that remaining bit subset's corresponding decoded data. Finally, all the decoded data are combined to generate total decoded data for the M data bits. Note that because the tenth aspect of the present invention does not need to use parity bits that are separate and distinguishable from the data bits, this aspect of the present invention is applicable to both systematic encoding and nonsystematic encoding.

For example, in example case 1 below, M=14 and N=26. The removed selected subset is $\tilde{P}$. The remaining bits are partitioned into two subsets, $\tilde{C}_1^{short}$ and $\tilde{C}_2^{short}$. $\tilde{C}_1^{short}$ is decoded only according to its own 11 bits, and no other information, and the first 7 bits of the resulting decoded word are the decoded data corresponding to $\tilde{C}_1^{short}$. $\tilde{C}_2^{short}$ is decoded only according to its own 11 bits, and no other information, and the first 7 bits of the resulting decoded word are the decoded data corresponding to $\tilde{C}_2^{short}$. If the decoding of $\tilde{C}_1^{short}$ fails but the decoding of $\tilde{C}_2^{short}$ succeeds, then the decoded $C_2^{short}$ is encoded using a [15,7,5] encoder to regenerate $P_2$, $P_2$ is XORed with $\tilde{P}$ to make $\tilde{P}_1$, $\tilde{C}_1^{short}$ and $\tilde{P}_1$ are concatenated to make $\tilde{C}_1$, and $\tilde{C}_1$ is decoded using a [15,7,5] decoder. The first 7 bits of the decoded $C_1^{short}$ and the first 7 bits of the decoded $C_2^{short}$ are concatenated to generate the decoded 14-bit header.

Preferably, the decoded data of the remaining bit subsets are combined by assembling the decoded data of the remaining bit subsets. For example, in example case 1 below, the first 7 bits of the decoded $C_1^{short}$ and the first 7 bits of the decoded $C_2^{short}$ are concatenated to generate the decoded 14-bit header.

Preferably, the remaining bit subsets are disjoint. For example, in example case 1 below, the first 7 bits of $\tilde{C}_1^{short}$ and the first 7 bits of $\tilde{C}_2^{short}$ are two disjoint subsets.

Preferably, all the remaining bit subsets are of equal size. For example, in example case 1 below, all the data bit subsets include 7 bits.

Preferably, each remaining bit subset is decoded according to its own bits using a corresponding first decoding scheme; and the decoding, according to the removed selected subset, of the remaining bit subset whose decoding by the first decoding scheme failed, includes using a corresponding second decoding scheme. For example, in example case 1 below, the first decoding schemes are [11,7,3] schemes and the second decoding scheme is a [15,7,5] scheme.

Preferably, for at least one of the remaining bit subsets, the corresponding first and second decoding schemes apply a common decoding method. For example, continuing the alternative to example case 1 of the fifth aspect of the present invention, both the first decoding scheme and the second decoding scheme are [11,7,3] schemes. The first decoding schemes use the stored parity bits that were generated by the encoding of the unpermuted header bits. If the decoding of the first 7 stored data bits fails but the decoding of the last 7 stored data bits succeeds, then the successfully decoded data bits are permuted and encoded to regenerate the corresponding parity bits. These regenerated parity bits are XORed with the last 4 stored parity bits to regenerate the parity bits of the first 7 permuted header bits, which are used in a second attempt to decode the first 7 stored data bits by performing a [11,7,3] decoding of permuted first 7 stored data bits.

Preferably, all the first decoding schemes are identical. For example, in example case 1 below, all the first decoding schemes are the same [11,7,3] decoding scheme.

Preferably, all the second decoding schemes are identical. For example, in example case 1 below, all the second decoding schemes are the same [15,7,5] decoding scheme.

BRIEF DESCRIPTION OF THE DRAWINGS

For a better understanding of the invention with regard to the embodiment thereof, reference is made to the accompanying drawings, in which like numerals designate corresponding sections or elements throughout, and in which:

FIG. 12 is a table depiction of a dual error location for block code [15,7,5], with respect to Example case 1 and Example case 2;

DETAILED DESCRIPTION OF THE PREFERRED EMBODIMENTS

Figure 1:
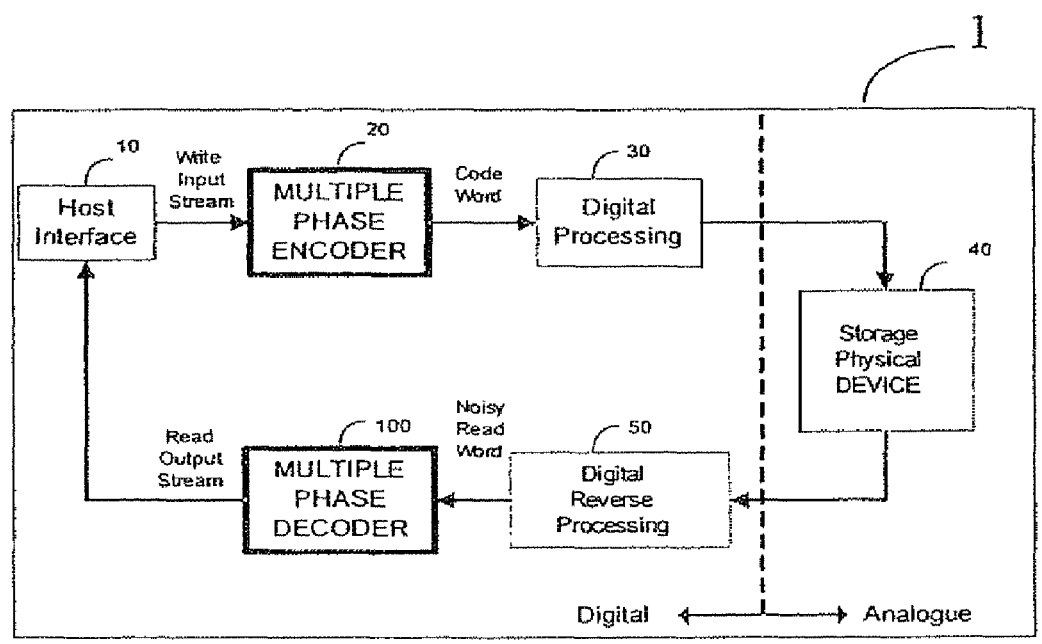
FIG. 1 is a block diagram of a preferred embodiment of a device of the present invention.

The present invention discloses a method and device providing an error correction coding scheme in order to ensure the reliability of the stored information. The proposed method approaches the performance of the long code while avoiding the circuitry complexity of the encoder and decoder of the long code. Hence, a size and complexity reduction of hardware and software implementations is obtained.

The term "A modification of decoded data" refers herein to a modification from a first value of decoded data to a second value of decoded data. In accordance with the method of the present invention, modification of decoded data of a certain short code word representation is effected based on other short code word representations. Therefore, an additional decoding attempt for a code word representation whose decoding has failed is carried out according to decoded data of the other short code word representations.

The term "A value of decoded data of a code word" refers herein to any valid numerical value. This term alternatively may refer to a logical indication that there is no presently known value, e.g. because decoding failed. Hence, "modification" of decoded data may be from one valid numerical value to another valid numerical value, from a logical indication of decoding failure to a valid numerical value, or from a valid numerical value to a logical indication of decoding failure.

The term "subset" refers herein in the present invention to both a proper subset that is smaller than the full set to which it is a subset, and to the full set itself.

It should be understood that modification of decoded data of one short word according to decoded data of other short words is provided by the present invention as an option and does not necessarily occur during each instance of decoding a long code word. For a specific instance of a long word, with a specific occurrence of errors, it may be the case that all short code word representations are successfully decoded on first attempt. In such case, no modification of decoded data is applied. Such modification is carried out only in a case of a failed decoding for at least one short word. Consequently, the term "effecting a modification" means "optionally effecting a modification depending on need".

The preferred embodiments of the method of the present invention are described herein in connection with Example case-1 and Example case-2. The two example cases disclose a device providing an error correction coding scheme, wherein the device is particularly well-suited for the use of data storage. Hence, the preferred device of the present invention comprises a decoder provided for increasing the delay for a particular word in order to apply further steps in the decoding process. Due to the peak delay (in rare cases), this error correction coding scheme might not be suitable for some communication systems applying a synchronous or semi-synchronous stream with fixed limited delay.

It is to be emphasized that the average delay introduced by the method of the present invention is not higher than methods known in the art. However, in the rare cases where the delay considerably increases, the method of the present invention is particularly suitable for storage media and less suitable for synchronous communication systems.

Example Case 1

There is provided a FLASH device containing independent bits, wherein there is one bit per nucleus cell and the Cell Error Rate (CER) is $4.7 \times 10^{-5}$. Because the FLASH device has one bit per cell, the Bit Error Rate (BER) is also $4.7 \times 10^{-5}$. A flash memory of the FLASH device includes many blocks; each block defined having several pages. Each page includes a header or control area and several sectors each of which is 512 data bytes long. It is required to design an error correction coding scheme in the flash controller for the FLASH device, while providing reliable storage for the header of each block containing 14 bits and achieving a Header Error Rate (HER) performance lower than $10^{-10}$ (HER<$10^{-10}$).

A 3 bit error correction capability is required for providing the performance goal of HER<$10^{-10}$ over a set of 14 bits with an input CER of $4.7 \times 10^{-5}$. The correction of one error (i.e. t=1) provides HER~$3.8 \times 10^{-7}$ and the correction of two errors (i.e. t=2) provides HER~$2.1 \times 10^{-10}$.

Hence, a three error correcting [29,14] BCH code is required, wherein the code rate R is equal to 0.4828 (i.e. 14/29) and the header is represented using one code word of length 29 bits.

The literature of coding and decoding of BCH codes as well as the ways to build such circuits is thoroughly studied over the years (see references [16]-[47]). An example of coding and decoding is provided for achieving the same HER goal performance, while employing the method of the present invention. The example described below utilizes a simplified controller that includes a component code capable of correcting only two errors instead of three. Moreover, because the length reduction is not necessarily a direct result of the number of errors (2 rather than 3) that the component code can correct, but instead has mainly to do with the entire scheme structure, the code length requires only 26 bits for each header instead of a 29 bit code (i.e. a higher code rate of R=14/26=0.5385 is achieved). The reduction gain achieved in the flash header size is 11.54%. This advantage is achieved in the following non-limiting example:

Instead of the [29,14] BCH code, a [15,7,5] block code is designed (hence reduced complexity for encoder/decoder hardware). The notation [n,k,d] commonly defines the code parameters as follows: 'n' refers to the code length, 'k' refers to the number of information bits, and 'd' refers to the codes' minimum Hamming distance.

A careful selection of such a code obtains a [11,7,3] punctured code (by extracting bits 12-15), resulting in a minimum Hamming distance that equals 3. Therefore, it is possible to correct a single error using this punctured code. Based on this observation, a 15 bit code having an error correction capability of 2 bits is disclosed. This 15 bit code is provided to correct any single error when removing the last four bits, i.e. using only the first 11 bits.

Figure 10:
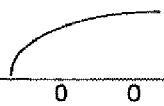
FIG. 10 is a depiction of the generator matrix for block code [15,7,5], with respect to Example case 1 and Example case 2.

The generator matrix 270 for this [15,7,5] block code is depicted in FIG. 10. The encoding process, i.e. the derivation of the 8 parity bits from the 7 information bits, is applied using the matrix multiplication operation over GF(2) as follows:

$$\underline{c}=\underline{m}\cdot G, [\underline{c}]=1\times15, [\underline{m}]=1\times7, [G]=7\times15, \quad (1.1)$$

wherein GF(2) is the notation for the Galois Finite Field with two elements, 'c' is defined as a row vector containing the code word, '$\underline{m}$' is defined as a row vector containing the 7 information bits, and 'G' is defined as the systematic encoding matrix.

Figure 11:
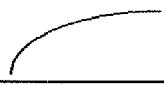
FIG. 11 is a depiction of the parity check matrix 'H' for block code [15,7,5], with respect to Example case 1 and Example case 2.

The decoding process of the [15,7,5] linear systematic block code is performed in two steps. In step one, an 8-bit syndrome is calculated using the parity check matrix 'H' of block code [15,7,5] 280, as depicted in FIG. 11. The syndrome calculation is carried out using the matrix multiplication operation over GF(2), as follows:

$$\underline{s}=H\cdot\underline{c}^T, [\underline{c}]=1\times15, [\underline{s}]=8\times1, [H]=8\times15 \quad (1.2)$$

wherein 'c' is a row vector containing the code word, 's' is a column vector containing the 8 bit syndrome, and 'H' is the parity check matrix, and the notation $(\ )^T$ means transpose, so that $\underline{c}^T$ is a column vector.

In step two, the 8 bit syndrome is used to access table 290 (see FIG. 12). Table 290 provides two 4 bit numbers, such that each of the 4 bit numbers defines the location of a single error in the 15 bit code word.

Note that the value '0' in table 290 refers to the case of 'no error'. In case table 290 contains two numbers in a specific entry where one of the values is a zero and the other value is a non zero, then this indicates that there is only one error and not two. Furthermore, a zero in the syndrome itself indicates there are no errors at all. The syndrome values are obtained assuming that the uppermost bit of the syndrome vector is the LSB (Least Significant Bit), while the lowermost bit is the MSB (Most Significant Bit). Notice that only 121 values (of the 256 possible values of the syndrome) are presented in the table. Since the decoder also includes an error detection capability, then for cases not presented in table 290, (see FIG. 12) there are more than two errors. However the decoder cannot point to their locations.

Figure 13:
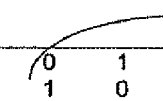
FIG. 13 is a depiction of parity check matrix $H^{(1)}$ for block code [11,7,3], with respect to Example case 1 and Example case 2.

Due to the special way in which this code is generated, a sub matrix '$H^{(1)}$' for correction of a single bit is provided. The correction of a single bit is applied to the first 11 bits of the same code word. The sub matrix '$H^{(1)}$' includes the first 4 rows and first 11 columns of the 'H' matrix. The decoding process of the first 11 bits of the 15 bit word is applied in two similar steps as follows:

At the first step, as described above, the syndrome calculation is obtained by the matrix multiplication operation over GF(2) as follows:

$$\underline{s}=H^{(1)}\cdot\underline{c}^T, [\underline{c}]=1\times11, [\underline{s}]=4\times1, [H]=4\times11 \quad (1.3)$$

wherein 'c' is a row vector containing the read word, 's' is a column vector containing the 4 bit syndrome, and $H^{(1)}$ is the sub-matrix of 'H' including said first 4 rows and said first 11 columns of the matrix 'H'. The matrix $H^{(1)}$ of block code [11,7,3] 300 is depicted in FIG. 13.

Figure 14:
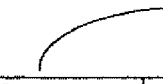
FIG. 14 is a table depiction of a single error location for block code [11,7,3], with respect to Example case 1.

At the second step of the decoding process, the error location is extracted from the 4 bit syndrome 310 (see FIG. 14). The syndrome bits having a value '0' define the case of 'no error'.

Upon a successful decoding of the first 11 bits of the 15 bit code word, the matrix 'G' of (1.1) can be used to regenerate the last 4 bits of the 15 bit code word, even though these last 4 bits are not provided to the decoder. Since the first 11 bits are already decoded, the size of the encoder is reduced to regenerate the last 4 bits directly from the first 7 bits out of the 11 decoded bits. This means that the regeneration of the last 4 bit requires only the last 4 columns of the matrix 'G'.

Using the above generated code word, the single [29,14] BCH code is replaced with a set of two disjoint words, denoted as $C_1, C_2$. $C_1$ and $C_2$ are two systematic code words, each of length 15. Disjoint word $C_1$ includes 7 information bits and 8 parity bits, whereas disjoint word $C_2$ includes the remaining 7 information bits and their associated 8 parity bits. Therefore, in total the same 14 information bits of the header are obtained. The encoding process is performed according to the above formulation, as depicted in (1.1).

The last 4 parity bits of each of the two disjoint words $C_1$, $C_2$ are defined as sub-sets $P_1$, $P_2$. The above referred to as the function of the entire data is simply the exclusive or (XOR) operation of these sub-sets (i.e. $P=P_1\oplus P_2$) (see FIG. 8). After encoding each of the 7 information bits, the two sub-sets $P_1$ and $P_2$ are extracted from $C_1$ and $C_2$. The remaining bits are then written to the FLASH device (i.e. only the first 11 bits of $C_1$ and the first 11 bits of $C_2$). The unified function of the entire data denoted by 'P' is defined the unified data because it unifies the disjoint sub groups of data. This unified set P is also written to the FLASH device.

This example case therefore incorporates 26 (11+11+4) bits altogether. It is further emphasized that the bits written to the flash device do not contain bits $P_1, P_2$, since these bits are extracted from the code word before the code word is sent to the physical storage media. The extracted bits that are regenerated during the decoding process are defined hereinafter as 'hidden bits'. As explained above, in the event that the first 11 bits are successfully decoded, then the remaining 4 bits can be regenerated via the encoding process. The decoding process, as detailed below in the section "Reading the header from the FLASH device (decode)", takes advantage of this property.

A person skilled in the art can appreciate that a fair comparison scenario is at hand, and that the implementation of such an encoding and decoding process is feasible. The consequence of this innovative error correction coding scheme directs the write (encode) and read (decode) operations as follows:

1. Writing the Header to the FLASH Device (Encode):
    Use the first set of 7 information bits of the header to encode the first [15,7] block code defined as $C_1$, using the process detailed above with respect to formulation (1.1). Denote bits 12-15 of this 15 bit code word $C_1$ as $P_1$.
    Use the second set of 7 information bits of the header to encode the second [15,7] block code word defined as $C_2$, using the process detailed above with respect to formulation (1.1). Denote bits 12-15 of this 15 bit code word $C_2$ as $P_2$.
    XOR sets $P_1$ and $P_2$ bit by bit respectively, in order to obtain 4 bits defined as parity-2 bits or bits 'P'.
    Write bits 1-11 of $C_1$ and bit 1-11 of $C_2$ to the FLASH device. Denote bits 1-11 of $C_1$ as $C_1^{short}$ and bits 1-11 of $C_2$ as $\tilde{C}_2^{short}$.
    Write the 4 bits 'P' to the FLASH device.

2. Reading the Header from the FLASH Device (Decode)
Read the two 11-bit words. The result is two words, depicted $\tilde{C}_1^{short}$ and $\tilde{C}_2^{short}$. In case there are no errors in the FLASH, then $\tilde{C}_1^{short} = C_1^{short}$ and $\tilde{C}_2^{short} = C_2^{short}$. In case of an error, then $\tilde{C}_1^{short}$ or $\tilde{C}_2^{short}$ contains errors with respect to the code words $C_1^{short}$ and $C_2^{short}$ originally written to the flash. Note, that in case of an error, then $\tilde{C}_1^{short}$ or $\tilde{C}_2^{short}$ respectively are depicted as words (not necessarily code words).

Decode words $\tilde{C}_1^{short}$ and $\tilde{C}_2^{short}$, according to the process detailed above with respect to formulation (1.3), i.e. a single error correcting decoder:

If both words are decoded successfully (because $\tilde{C}_1^{short}$ has 0 or 1 errors and $\tilde{C}_2^{short}$ has 0 or 1 errors)—the header is read successfully as the first 7 bits of the 11 bit decoded word $C_1^{short}$ and the first 7 bits of the 11 bit decoded word $C_2^{short}$. In case of a non-systematic code, further information (e.g. a table or other transformation) is required for reading the header successfully.

If both words failed to decode (because $\tilde{C}_1^{short}$ has 2 or more errors and $\tilde{C}_2^{short}$ has 2 or more errors)—the header is not read successfully.

If one word failed to decode while the other word is successfully decoded (because one word has 0 or 1 errors and the other word has 2 or more errors)—the decoding process proceed to step 3.

3. Reading the Header in Case Exactly One Sub Code Fails:

Read bits $\tilde{P}$ from the FLASH device. These bits are defined as $\tilde{P}$ and not P, since there also might be a difference between $\tilde{P}$ and 'P'. As $\tilde{P}$ bits are read from the flash device as well, and it is assumed that the flash device introduces errors.

If the decoding of $\tilde{C}_1^{short}$ fails while the decoding of $C_2^{short}$ succeeds, $\tilde{P}_1$ is regenerated from $C_2^{short}$ and $\tilde{P}$ as follows:

Regenerate from $C_2^{short}$ the hidden $P_2$ bits of $C_2$ by applying the encoding process, as detailed above with respect to formulation (1.1).

XOR bits $\tilde{P}$ with regenerated hidden bits $P_2$ to generate $\tilde{P}_1$.

Generate $\tilde{C}_1$ from $\tilde{C}_1^{short}$ and $\tilde{P}_1$ by way of arranging the bits $\tilde{C}_1^{short}$ in $\tilde{C}_1$ at bit location 1-11 and bits $\tilde{P}_1$ in $\tilde{C}_1$ at bit location 12-5.

Decode $\tilde{C}_1$ using all 15 bits as a two error correcting [15,7] block code by applying the decoding process detailed above, with respect to formulation (1.2).

If decoding is successful, then the header is read successfully. Otherwise, the reading of the header has failed.

If the decoding of $\tilde{C}_2^{short}$ fails while the decoding of $\tilde{C}_1^{short}$ succeeds, then regenerate $\tilde{P}_2$ from $C_1^{short}$ and $\tilde{P}$ as follows:

Regenerate from $C_1^{short}$ the hidden $P_1$ bits of $C_1$ by applying the encoding process, as detailed above with respect to formulation (1.1).

XOR bits $\tilde{P}$ with regenerated hidden bits $P_1$ to generate $\tilde{P}_2$.

Generate $\tilde{C}_2$ from $\tilde{C}_2^{short}$ and $\tilde{P}_2$ by way of arranging the bits $\tilde{C}_2^{short}$ in $\tilde{C}_2$ at bit location 1-11 and $\tilde{P}_2$ in $\tilde{C}_2$ at bit location 12-15.

Decode $\tilde{C}_2$ this time with all 15 bits as a two error correcting [15,7] block code by applying the decoding process detailed above, with respect to formulation (1.2).

If decoding is successful, then the header is read successfully. Otherwise, the decoding of the header has failed.

Mathematical Analysis of Example Case-1

The following section describes in detail the mathematical analysis performed in the method of the present invention in order to evaluate the achieved gain in size and circuitry complexity. The achieved gain related to controller complexity is obvious, since the implementation of a decoder that is capable of correcting two errors is simpler than the implementation of a decoder that is capable of correcting 3 errors.

For computing the reference scheme, let p be defined as the FLASH device input BER (i.e. in our example $p=4.7 \times 10^{-5}$). The HER performance of the decoder, wherein [n=15, k=7, d=5, t=2], is given according to the binomial distribution as follows:

$$HER_{t=2, n=15} = \sum_{i=3}^{24} \binom{24}{i} \cdot p^i \cdot (1-p)^{24-i} \Bigg|_{p=4.7 \cdot 10^{-5}} \quad (1.4)$$
$$= 2.1 \times 10^{-10},$$

wherein 't' refers to the error correction capability (i.e. the maximum number of erroneous bits that can be corrected) as follows: $t = \lfloor (d-1)/2 \rfloor$. Because according to (1.4) it is insufficient to correct two errors, as the HER is above $10^{-10}$, the reference scheme is forced to use a three-error-correction BCH code. Now turning to the calculation of the HER performance employing the scheme of the present invention, the present invention's Sub Code Error Rate (SCER), wherein [n=11, k=7, d=3, t=1], is accordingly given by:

$$SCER_{t=1, n=11} = \sum_{i=2}^{11} \binom{11}{i} \cdot p^i \cdot (1-p)^{11-i} \Bigg|_{p=4.7 \cdot 10^{-5}} \quad (1.5)$$
$$= 1.2 \cdot 10^{-7}$$

The first contributor to HER performance is the case of a failed decoding of two sub-codes in the header. This probability is calculated as follows:

$$HER_{2,1} = (SCER_{n=11, t=1})^2 = 1.47 \cdot 10^{-14} \quad (1.6)$$

The second contributor to the HER performance is the case of a failed decoding of one word in the first stage, and a failed decoding of more than two errors (when trying to decode up to two errors with 15 bits) in the second stage. This probability is calculated as follows:

$$HER_{2,2} = 2 \cdot SCER_{t=1, n=11} \cdot (1 - SCER_{t=1, n=11}) \cdot \quad (1.7)$$
$$\frac{SCER_{t=2, n=15}}{SCER_{t=1, n=11}}$$
$$= 9.4 \cdot 10^{-11}$$

Combining the two probabilities yields:

$$HER_2 = HER_{2,1} + HER_{2,2} \approx HER_{2,2} = 9.4 \cdot 10^{-11} \quad (1.8)$$

The second contribution to the HER performance $HER_{2,2}$ is calculated as follows:

The left two factors $SCER_{t=1, n=11}(1 - SCER_{t=1, n=11})$ are to be multiplied by '2', because there are two possibilities for a first failed decoding sub code and a second successful decoding sub-code. The first possibility is obtained when the decoding of the first sub-code fails while the decoding of the second sub-code succeeds according to the single error correction block code. The second possibility is obtained when the decoding of the first sub-code succeeds while the decoding of the second sub-code fails according to the single error correction block code.

The right-most factor $$\frac{SCER_{t=2,n=15}}{SCER_{t=1,n=11}}$$

is the result of a division of two values. This result corresponds to the probability that there are more than two errors in the set of 15 bits, provided that there is more than '1' error in a subset of 11 bits. Define the event of more than 1 error in a subset of 11 bits as event 'x' and the event that there are more than 2 errors in the set of 15 bits as event 'y'. Therefore, the event P(y|x) is obtained according to Bayes law as follows:

$$P(y \mid x) = \frac{P(y, x)}{P(x)} \quad (1.9)$$

The event P(y,x) refers to the existence of more than 2 errors in the set of 15 bits and more than 1 error in a subset of 11 bits. It is obvious that all the cases of more than 2 errors in the set of 15 bits contain the events that a subset of these 15 bits includes more than 1 error. Therefore P(y,x)=P(y), and the rightmost element in formulation (1.7) is P(y)/P(x).

Example Case 2

There is provided the same FLASH device as disclosed above in Example case 1, i.e. there is one bit per cell and the Cell Error Rate (CER) is $4.7 \times 10^{-5}$. It is required to design a FLASH device comprising a decoder, such that the decoder is implemented to provide reliable storage of a sector data area containing 512 bytes (of 8 bits each). Since the data itself is of less importance than the header of each sector, then the target performance for the data, i.e. SER (Sector Error Rate), is lower than $5 \times 10^{-8}$. The design of the FLASH device is limited to a simple ECC (Error Correction Code) hardware (i.e. a 15 bit block code, as already designed for the header).

The correction of t=1 error obtains SER~$1.36 \times 10^{-4}$. The correction of t=2 errors obtains SER~$2.8 \times 10^{-8}$. The code rate R is defined by the number of information bits k divided by the code length n. In, other words, using a total of $\lceil 512 \times 8/7 \rceil = 586$ code words to represent the sector of length 4096 bits provides a total code rate of $R=512 \times 8/(586 \times 15)=0.466$. Hence, a two error correcting [15,7,5] block code with a code rate R=7/15=0.466 is sufficient.

Instead of using a design of 586 code words each of length 15, a new design containing 586 punctured code words of 7 information bits and 4 parity bits is provided, while maintaining the same restriction described herein above. The second set of 4 parity bits from all sub-codes is XORed, whereas the 4 bit result is stored in the flash device. In this manner, the method of the present invention enables to meet the target performance of SER<$5 \times 10^{-8}$ using the same hardware design and providing a higher code rate of R=4096/(586×11+4)=0.635 bits per cell. The gain is the significant reduction of flash device size by 26.6%. The read and write operations of a sector are carried out as follows:

1. Writing a Sector to the FLASH Device (Encode):
    Encode 586 code words of the [15,7,5] block code using the 4096 information bits of the sector.
    XOR bits 12-15 of all 586 code words to obtain 4 bits, defined as parity-2 bits.
    Write to the FLASH device bits 1-11 of all 586 code words.
    Write the 4 parity-2 bits to the FLASH device.
2. Reading a Sector from the FLASH Device (Decode):
    Read the 586 code words of length 11 from the flash device.
    Decode the 586 words using the single error correcting decoder for [11,7,3] block code decoder.
    If all code words are decoded successfully the sector is decoded successfully.
    If more than 1 word failed to decode—then there is a failure in the decoding of the sector.
    If a single word failed to decode while the other 585 words have decoded successfully—perform the following steps:
    Regenerate hidden parity bits 12-15 of all 585 words that were successfully decoded by applying the encoding process detailed above, with respect to formulation (1.1)
    Read parity-2 bits from the FLASH device.
    XOR parity-2 bits with hidden parity bits 12-15 of all 585 code words that were successfully decoded, in order to estimate bits 12-15 of the 586$^{th}$ word that failed to decode.
    Decode the failed word again now with all 15 bits with a dual error correcting [15,7,5] block code decoder process as detailed above, with respect to formulation (1.2). If decoding is successful, then the sector is successfully read. Otherwise, there has been a failure in the decoding of the sector.

The method of the present invention using Example case 2 achieves the following advantages:
    Reduced flash device size (a reduction of 26% in the number of cells) or providing a higher code rate (0.635 instead of 0.466).
    The same SER performance requirement is maintained.
    The same hardware complexity—using a [15,7,5] block code encoder/decoder.
    Unified hardware for header and data encoding and decoding procedures.

Mathematical Analysis of Example Case-2

Figure 9:
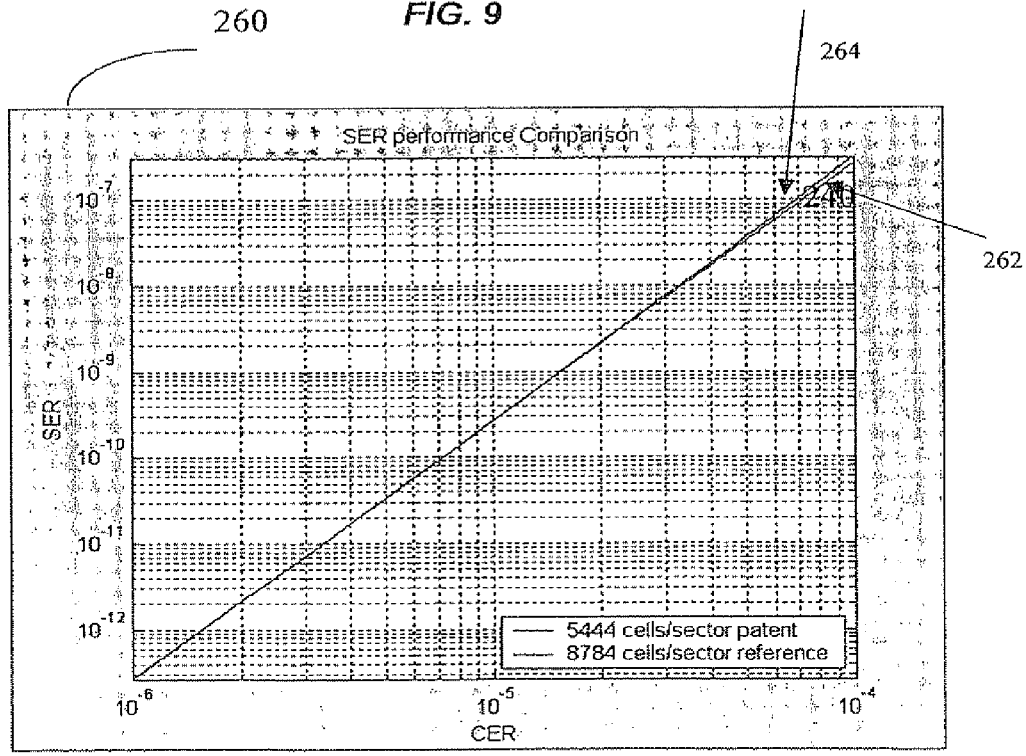
FIG. 9 is a graphical illustration of CER performance vs. SER performance, with respect to Example case 2.

The SER analysis provides a comparison between the reference scheme and the scheme of the present invention is depicted in FIG. 9. The formulation used to achieve these values is given in the following section.

1. Reference Scheme (Curve 262):

Let p denote the CER performance (i.e. in our example p=$4.7 \times 10^{-5}$) of the FLASH device. The frame error rate (FER) of a [n=15, k=7, t=2] block code decoder is given by:

$$FER_{t=2,n=15} = \sum_{i=3}^{15} \binom{15}{i} \cdot p^i \cdot (1-p)^{15-i} \bigg|_{p=4.7 \cdot 10^{-5}} \quad (2.1)$$

$$= 4.7 \times 10^{-11}$$

The SER performance of the reference scheme (586 code words of a [n=15, k=7, t=2] block code) is given by:

$$SER_1 = 1 - (1-FER_{t=2,n=15})^{586}\big|_{FER_{t=2,n=15}=4.7 \cdot 10^{-11}} = 2.8 \times 10^{-8} \quad (2.2)$$

2. Present Invention Scheme (Curve 264):

The frame error rate of a [n=11, k=7, t=1] block code decoder is given by:

$$FER_{t=1,n=11} = \sum_{i=2}^{11} \binom{11}{i} \cdot p^i \cdot (1-p)^{11-i} \Big|_{p=4.7 \cdot 10^{-5}} \quad (2.3)$$

$$= 1.2 \cdot 10^{-7}$$

The first contributor to the SER performance of the FLASH device refers to the case of two or more failing words in a sector. This probability is defined by:

$$SER_{2,1} = \sum_{i=2}^{586} \binom{586}{i} \cdot FER_{n=11,t=1}^i \cdot \quad (2.4)$$

$$(1 - FER_{n=11,t=1})^{586-i} \Big|_{FER_{n=11,t=1}=1.2 \cdot 10^{-7}}$$

$$= 2.5 \cdot 10^{-9}$$

The second contributor to the SER performance of the FLASH device refers to the case of a single word failure in the first stage and more than two errors in the second stage (when decoding 15 bits with a decoder capable of decoding up to two errors). This probability is defined by:

$$SER_{2,2} = 586 \cdot FER_{t=1,n=11} \cdot (1 - FER_{t=1,n=11})^{585} \cdot \quad (2.5)$$

$$\frac{FER_{t=2,n=15}}{FER_{t=1,n=11}} \Big|_{\substack{FER_{t=1,n=11}=1.2 \cdot 10^{-7} \\ FER_{t=2,n=15}=4.7 \cdot 10^{-11}}}$$

$$= 3.0 \cdot 10^{-8}$$

Combining the two contributors provides a probability of:

$$SER_2 = SER_{2,1} + SER_{2,2} = 3.3 \cdot 10^{-8} \quad (2.6)$$

Referring now to FIG. 1, there is shown a block diagram including an encoder and a decoder of a device of the present invention. The device 1 of the present invention includes a Host Interface module 10 for receiving information from the application and storing it within device 1.

Host Interface 10 transfers the information to a Multiple Phase Encoder 20. The Multiple Phase Encoder 20 carries out the 'writing the header to the flash device' process, as described above and is presented in further detail in FIGS. 2 and 3. Multiple Phase Encoder 20 converts a block of K information bits to a code word of N bits, where N>K. With respect to Example case 1, K=14 and N=26.

This N-bit block is then transferred to a Digital Processing Unit 30. The Digital Processing Unit 30 is provided for adding a data sector to the block, as described in Example case 2, and performing other digital procedures before the block is written to the cells. Such digital procedures optionally include interleaving and gray mapping procedures. The Digital Processing Unit 30 may be any processing unit known in the art.

The processed N-bit block is then transferred to a Storage Device 40 provided for storing the physical information bits.

Upon reading a block from Storage Device 40, the block is transferred to a Digital Reverse Processing Unit 50 in order to convert the N-bit block to the same format as was presented at the output of Multi Phase Encoder 20.

The N-bit block is then transferred from Digital Reverse Processing Unit 50 to a Multiple Phase Decoder 100. Multiple Phase Decoder 100 is provided for recovering the 14 information bits of the header from the 26 bit header code word, as described above in the section 'Reading the header from the FLASH device' and in further detail in FIGS. 4-6.

The recovered information bits of the header are then transmitted back to Host Interface 10.

Figure 2:
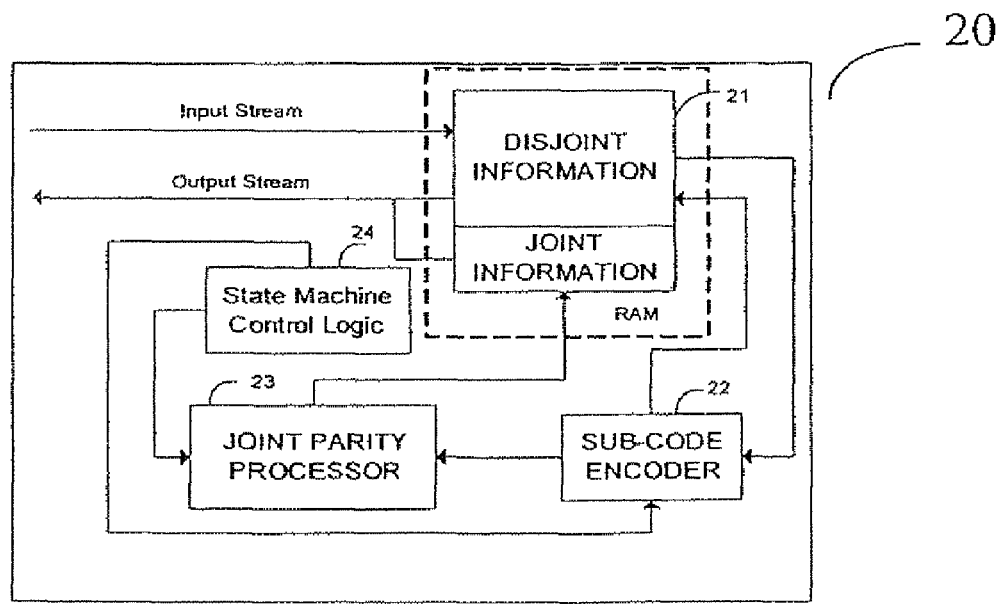
FIG. 2 is block diagram of the components comprising the Multiple Phase Encoder of FIG. 1.

Referring now to FIG. 2, there is shown a block diagram of the components comprising the Multiple Phase Encoder 20 of FIG. 1. The 14 information bits are transferred from Host Interface 10 and stored in the upper part (disjoint section) of a Random Access Memory (RAM) 21. The disjoint section of RAM 21 provides a storage area for 22 bits.

A State Machine Control Logic block 24 is provided to activate the Sub-Code Encoder 22 to encode the first 7 information bits out of the 14 information bits into 15 bits using the [15,7,5] block code encoder.

Bits 12-15 of these 15 bits are transferred to a Joint Parity Processor 23, while the four new parity bits (bits 8-11) from the Sub-Code Encoder 22 are transmitted back to the upper part (referred to as the disjoint section) of RAM 21. A Joint Parity Processor 23 is provided for applying a mathematical compression formulation (e.g. XOR) on the second type parity bits of all sub-codes.

From RAM 21, the second set of 7 information bits are transferred to the Sub-Code Encoder 22 and encoded into a [15,7,5] block code word. Information bits 12-15 from the 15 bits of the block code word are transferred to the Joint Parity Processor 23, while the added four parity bits (bits 8-11) are transferred back from Sub-Code Encoder 22 to the upper part of RAM 21, thus completing an encoding of the second set of 7 bits into an 11-information bit [11,7,3] code.

In the Joint Parity Processor unit 23 these four information bits 12-15 are XORed bit by bit with the four bits already stored in unit 23. The result is stored at the lower part (referred to as the joint section) of RAM 21.

Figure 3:
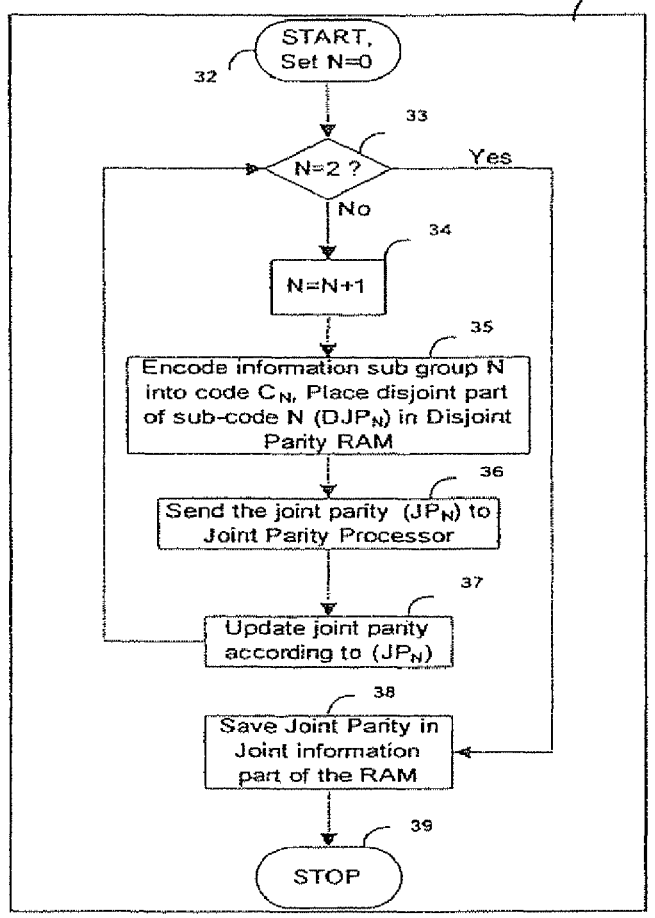
FIG. 3 is a flow chart of the encoding process as carried out in State Machine Control Logic block of FIG. 2.

Referring now to FIG. 3, there is shown a flow chart of the encoding process 31 as carried out in State Machine Control Logic block 24 of FIG. 2. At the first step 32, the sub-code number 'N' is initiated to 0.

At the next step 33, it is checked whether the value of the variable 'N' has reached the value of 2, i.e. two sub-codes with respect to Example case 1. Since at this stage of the encoding process 'N'=0, the value of 'N' is incremented by 1 (step 34) in order to indicate that State Machine Control Logic block 24 is encoding sub-code 1.

At the next step 35, Sub-Code Encoder 22 (see FIG. 2) is activated to encode sub-code 1. Bits 1-11, defined as $DJP_1$, are stored in the upper part of RAM 21.

At step 36, bits 12-15, defined as $JP_1$, are stored in Joint Part Processor (JPP) unit 23 (see FIG. 2).

At step 37, these four bits 12-15 are updated (i.e. XORed with the initial four zeros). The encoding process then returns to step 33.

At the next step 33, the value of the variable 'N' is checked again to determine if it has reached the value of 2 at this cycle of the loop. Since at this stage N=1, the encoding process proceeds to step 34 for executing a second cycle of the loop.

At step 34, the value of the variable 'N' is incremented by '1' to equal N=2.

At step 35, the second group of 7 bits is encoded to a 15 bits code word. The last 4 bits of the first 11 bits, defined as $DJP_2$, are stored in the upper part of RAM 21. The last 4 bits of the 15 bits are defined as $JP_2$.

At step 36, JP$_2$ bits are transferred to the JPP unit 23 (see FIG. 2).

At the next step 37, JP$_1$ bits are XORed with JP$_2$ bit by bit in order to generate the four output JPP bits of JPP unit 23.

Following this step, the encoding process returns to step 33. Upon reaching step 33, the value of the variable 'N' is equal to 2. Hence, in the affirmative case ('N'=2), the encoding process proceeds to step 38.

At step 38, the resulting JP bits are written to the lower part of RAM 21.

At the last step 39, the encoding process comes to an end.

Figure 4:
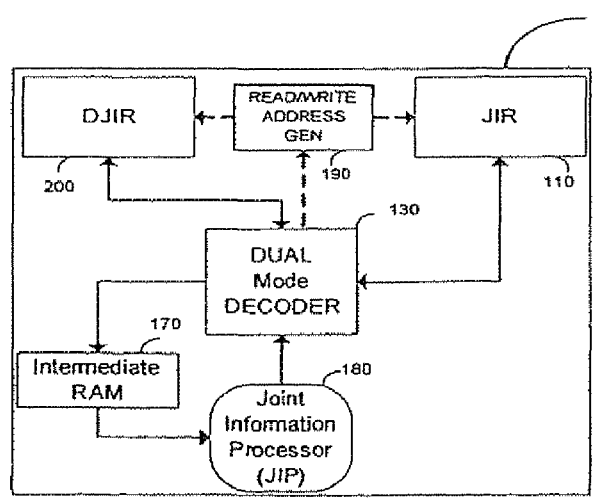
FIG. 4 is a block diagram of the components comprising the Multiple Phase Decoder of FIG. 1.

Referring now to FIG. 4, there is shown a block diagram of the components comprising the Multiple Phase Decoder 100 of FIG. 1. The implementation of Multiple Phase Decoder 100 is provided to distinguish between a RAM unit storing joint information (JIR) 110 and a RAM unit storing disjoint information (DJIR) 200. The distinction between the two types of information is due to the fact that in practice, when taking under consideration the probability of using the JIR unit previously in the mathematical analysis, it was found that this probability is considerably small. Therefore, in order to reduce circuitry complexity it is advisable to differentiate between these two RAM units.

DJIR 200 is provided for storing the 22 bits of the first and second disjoint information words. These words are transferred to a Dual Mode Decoder unit 130, which reads these 22 bits via a Control Unit 190. The Dual Mode Decoder unit 130 is activated in the single error correction mode, with respect to Example case 1 as described above.

In case the decoding of the first word succeeds, then the DJIR unit 200 is updated if necessary with the corrected bit via the Control Unit 190. The decoding process is then repeated for the second 11-bit word.

In case the decoding of both the first and second words succeeds, then the JIR unit 110 is left inactivated. In case the decoding of both words fail, then the complete decoding process fails.

In case of a decoding failure in either one of sub-words (first sub-word or second sub-word) but not in both sub-words, then a second attempt to decode the failing sub-word is made using the successfully decoded sub-code.

For example, if the decoding of the first sub-code has succeeded and the decoding of the second sub-word has failed, then a second attempt is made to decode the second sub-word using the successfully decoded first sub-code. The four bits from the JIR unit 110 are read via Control Unit 190 and stored in the Intermediate RAM (IR) unit 170. The first sub-code is re-read to the Multiple Phase Encoder 20 (see FIG. 2) via Control Unit 190. Multiple Phase Encoder 20 re-generates the 4 JP$_1$ bits and then transfers them to the IR unit 170. A Joint Information Processor (JIP) unit 180 is provided for XORing JP and JP$_1$ bits, bit by bit. The result is stored in the Dual Mode Decoder unit 130 in locations 12-15 of the [15,7,5] block code. The second sub code is re-read from the DJIR to Dual Mode Decoder unit 120 in location 1-11 of the [15,7,5] block code to generate a 15 bit word. In such a case, the Dual Mode Decoder unit 130 is activated in the dual bit error correction mode. In case the Dual Mode Decoder unit 130 fails to decode in the dual error correction mode, then the complete decoding process fails. However, in case the Dual Mode Decoder unit 130 succeeds to decode in the dual error correction mode, then the DJIR unit 200 is updated with the corrected bits and the read process is declared successful.

Alternatively, a similar decoding process is carried out in case the decoding of the second sub-word (defined as a sub-code upon a successful decoding) has succeeded and the decoding of the first sub-word has failed, such that the operational functionality between the first sub-code and the second sub-word, as described herein in the example above, is exchanged.

The present invention is described herein as providing a single decoder for decoding a long code word. However, the present invention is not limited to a single decoder only, and is equally applicable for providing a plurality of decoders, each decoding a code word having fewer bits than the long code word.

Figure 5:
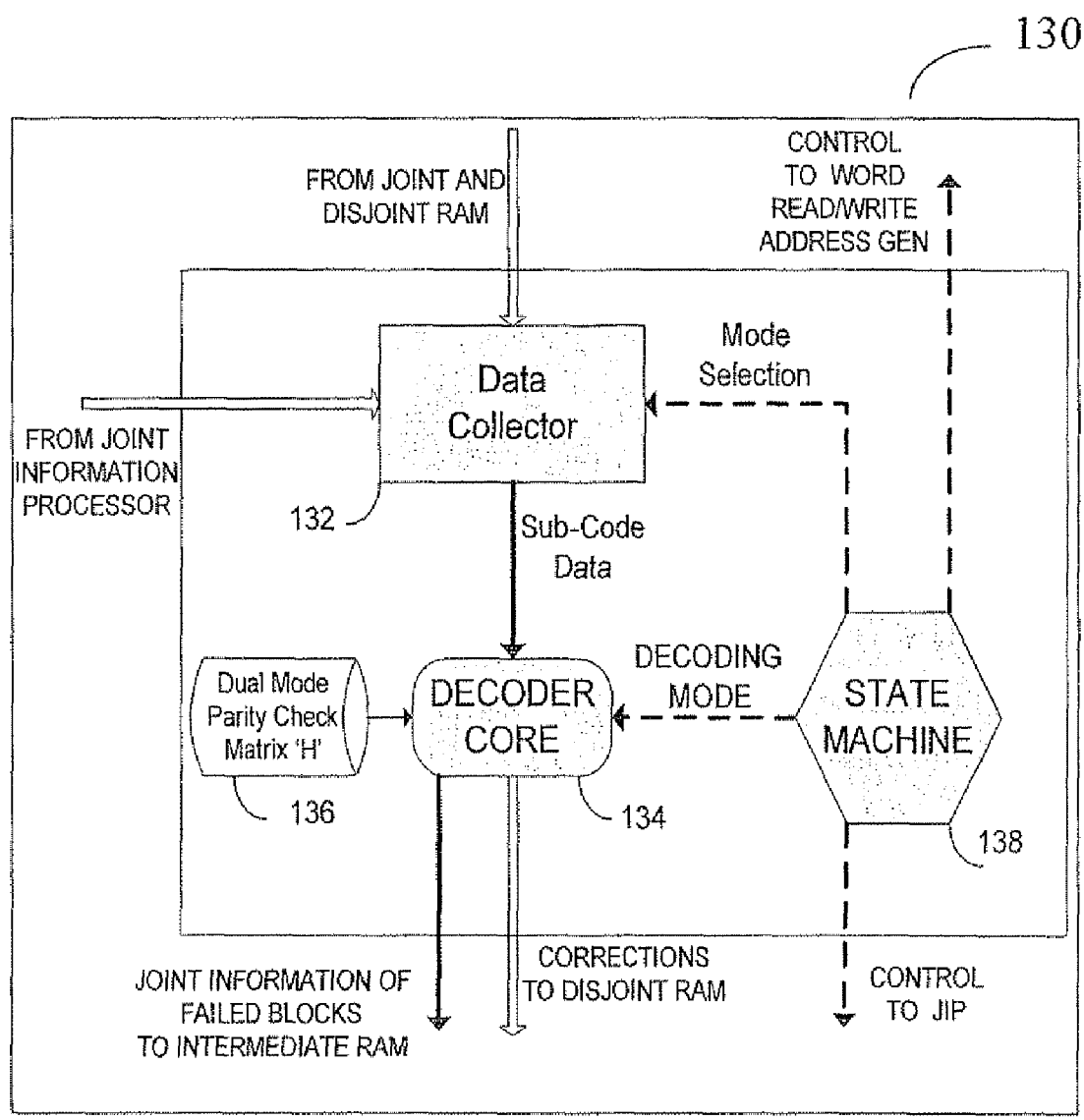
FIG. 5 is a block diagram of the components comprising the Dual Mode Decoder unit of FIG. 4.

Referring to FIG. 5, there is shown a block diagram of the Dual Mode Decoder unit 130 of FIG. 4. A State Machine unit 138 is provided to control the decoding process carried out by the Dual Mode Decoder unit 130.

Information bits transferred from the DJIR unit 200, the JIR unit 110, and the JIP unit 180 (see FIG. 4), are collected together in a Data Collector unit 132. The collection is controlled by the State Machine unit 138.

The information bits received from the Data Collector unit 132 are decoded at a Decoder Core unit 134. For the computation required for the decoding process a Parity Check Matrix unit 136 is employed according to a single error or a dual error correction mode. The Parity Check Matrix 136 contains in each line a parity check on the received word. Each such line in the matrix contains a value '1' in a location being checked. The checking procedure is the operation of XORing the elements of the word in the locations were the parity check line contains the value '1'. The checking procedure is successful if the outcome of the XOR operation returns a zero. In case all checking procedures return a zero, then the received word is determined as a code word. The result of applying the Parity Check Matrix 136 on the received word is the received word's syndrome. A received word's syndrome containing a non-zero value indicates that the received word is not a code word. Applying the Parity Check Matrix 136 on a received word is carried out according to the procedure detailed above, with respect to equation (1.2) or equation (1.3).

With respect to Example case 1—the matrix implemented in the Parity Check Matrix unit 136 (see FIG. 5) is provided for both a single error and a dual error correction mode, such that the matrix used in a single error correction mode is in fact a subset of the matrix used in the dual error correction mode.

Figure 6:
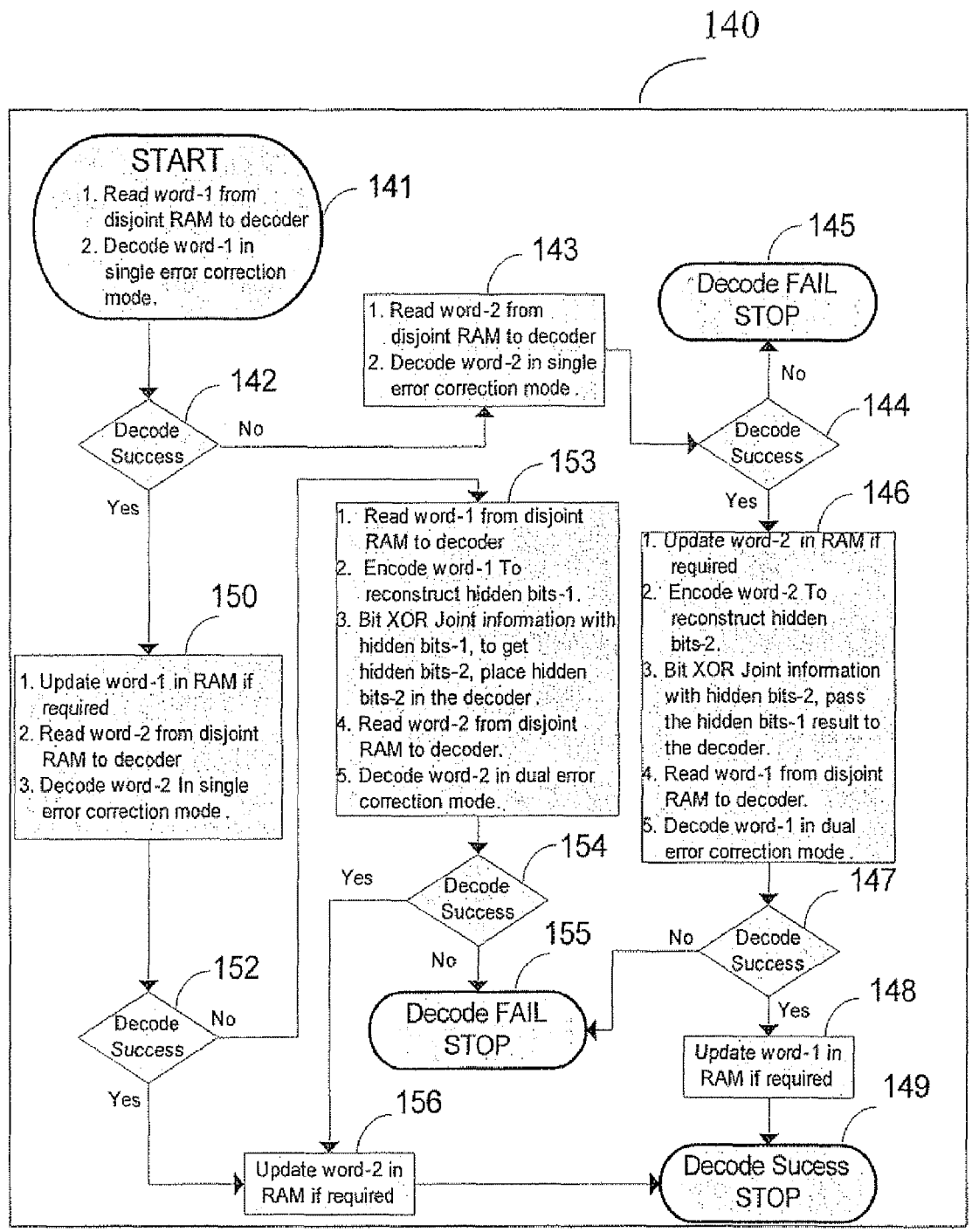
FIG. 6 is a flow chart of the decoding process with respect to Example case 1.

Referring to FIG. 6, there is shown a flow chart 140 of the decoding process, with respect to Example case 1. In the initial step 141, the first word is read from DJIR 200 (see FIG. 4). Then the Dual Mode Decoder 130 is activated in the single error correction mode.

At the next step 142, State Machine unit 138 (see FIG. 5) checks whether the decoding of the first word has succeeded.

In the affirmative case, the decoding process proceeds to step 150. In step 150, the first word is updated with the corrections, in case there were corrections. At this step the Dual Mode Decoder 130 (see FIG. 4) is activated for decoding the second word read from DJIR 200 (see FIG. 4) in the single error correction mode. In the next step 152, State Machine unit 138 (see FIG. 5) checks whether the decoding of the second word has succeeded. In the negative case (i.e. the decoding of the first word in the single error correction mode has succeeded and the decoding of the second word in the single error correction mode has failed), the decoding process continues to step 153. However, in the affirmative case—the decoding process proceeds to step 156. In step 156, the second word is updated with the corrections in case there were corrections and the decoding process finalizes successfully (step 149).

In the first negative case (i.e. in the event the decoding of the first word fails), the decoding process continues to step 143. In step 143, the second word is read from DJIR 200 (see FIG. 4) and decoded in the single error correction mode.

In the next step 144, State Machine unit 138 (see FIG. 5) checks whether the decoding of the second word has succeeded. In the negative case the complete decoding process fails and is brought to an end at step 145. However in the affirmative case (i.e. the decoding of the second word succeeded), the decoding process continues to step 146.

In step 153, an additional decoding attempt is made to decode the second word using the information obtained from the successfully decoded first word and from the four external joint bits. In this step, the 11 bits of the second word are re-read from the DJIR unit 200 (see FIG. 4). The second word's last four bits are regenerated from the four hidden bits of the first word XORed with the four joint bits obtained from unit JIR 110 (see FIG. 4). The hidden bits of the first word are obtained by applying the encoder on the 11 bits successfully decoded from the first word. The Dual Mode Decoder 130 (see FIG. 4) is activated for decoding the second word in the dual error correction mode. In the next step 154, the State Machine unit 138 (see FIG. 5) checks whether the additional decoding of the second word has succeeded.

In the negative case, the complete decoding process has failed and is brought to an end at step 155.

However, in the affirmative case, the decoding process proceeds to step 156. In step 156, the second word is updated to the DJIR 200 (see FIG. 4) with the corrections found in the second decoding attempt for the second word. The decoding process then proceeds to the last step 149. In the last step 149, a successful decoding process is declared and decoding is finalized.

In step 146 a second attempt for decoding the failed first word is made in a similar manner to the decoding process carried out for the first word in step 153 (such that the operational functionality between the first word and the second word is exchanged).

In the next step 147, State Machine unit 138 (see FIG. 5) checks whether the additional decoding of the first word has succeeded.

In the negative case, the complete decoding process has failed and is brought to an end at step 155.

However, in the affirmative case, the decoding process continues to step 148. In step 148, the first word is updated to the DJIR unit 200 with the corrections found in the second decoding attempt for the first word. In the last step 149, a successful decoding process is declared and decoding is finalized.

Figure 7:
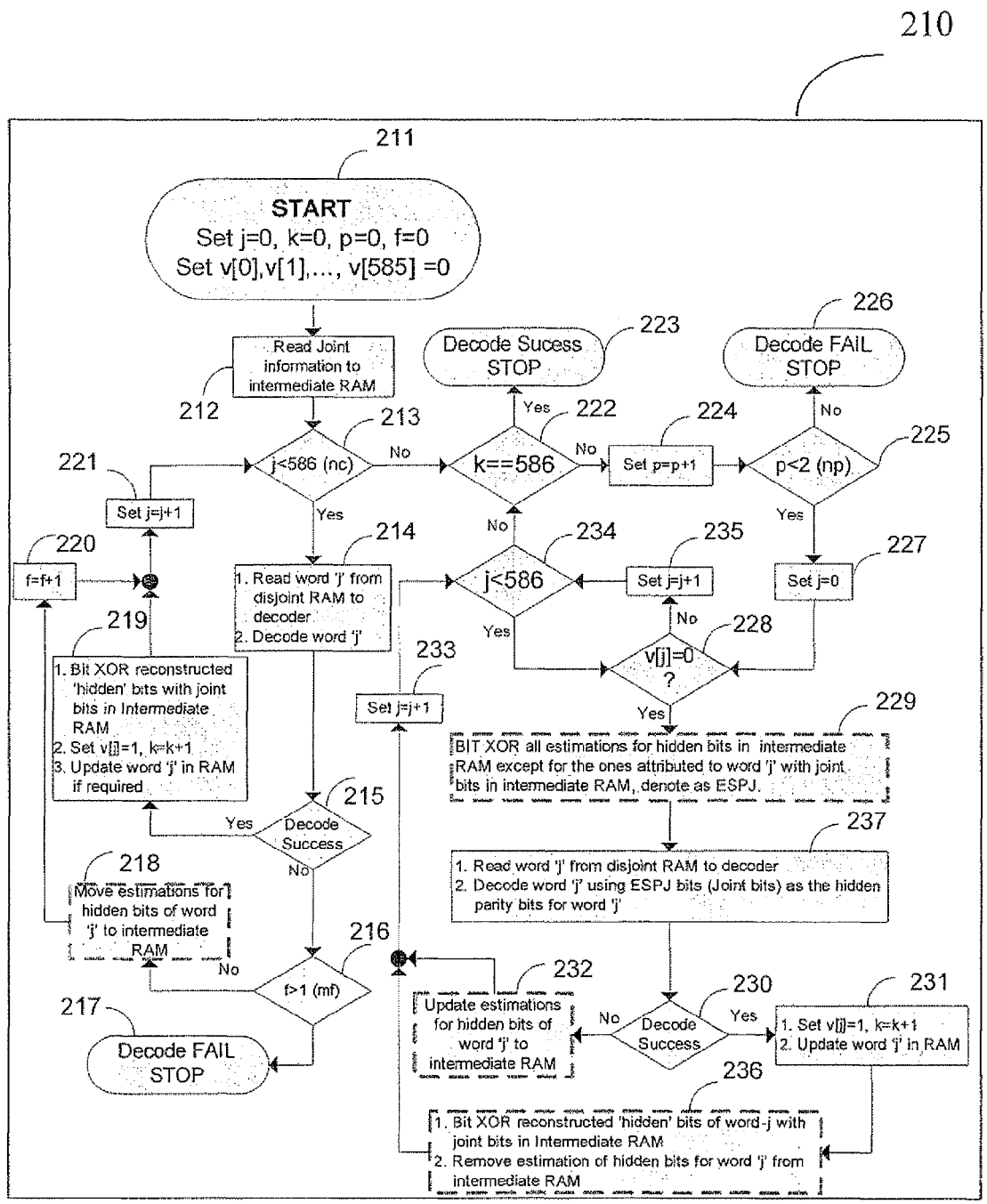
FIG. 7 is a flow chart of the decoding process with respect to Example case 2.

Referring to FIG. 7, there is shown a flow chart of the decoding process with respect to Example case 2. The decoding process detailed herein in FIG. 7 is further suitable for the implementation of soft decoders. The units which are exclusively implemented for employing soft decoders are marked in dotted line and are unused with respect to Example case 2.

In the initial step 211, initialization is carried out for several variables used in the decoding process. These variables include the number of successful decoded sub-codes (k), the number of disjoint sub-words (nc), the number of current word to process (j), a phase counter (p), a maximal phase value (np), the number of failing words in single error correction mode (or first decoder in the more general case) (f), a maximal number of failed decoding in single error correction mode (or first decoder in the more general case) (mf).

The vector 'v' is provided for storing a value '1' per each sub-code that is successfully decoded in the corresponding element location of vector 'v'. At the beginning of the decoding process all elements of vector 'v' are initialized to '0', since no knowledge regarding the correctness of any of the sub-codes exists. With respect to Example case 2, the number of sub-words nc is initialized to 586, and therefore the number of elements in vector 'v' is 586.

The variable 'j' is initialized to zero. Variable 'j' is the numeral of the currently decoded sub-code. The variable 'p' defines the phase number currently running in the decoding process, and is initialized to '0'.

The variable 'np' defines the maximal phase number. With respect to Example case 2, it is possible to activate only two phases, i.e. phase-0 defining the single error correction mode and phase-1 defining the dual error correction mode. Note that in the event of a soft decoder implementation, it may be the case that more than two phases are executed, such that a single sub-code is decoded more than twice.

The variable 'f' defines the number of sub-words that failed to decode in phase-0. With respect to Example case 2, the decoding process is not able to regenerate the hidden bits of a sub-word in case there is more than a single failure in phase-0. However, in the event of a soft decoder implementation—the variable 'f' may be set to any value up to 'nc', according to specific design considerations.

The variable 'k' defines the number of successfully decoded sub-codes and is set to k=586−f once phase-0 is attempted on all sub-words and the value of 'f' is set. In order to avoid a new computation of the variable 'k' each time the variable 'f' is updated—the variable 'k' is defined independently of the variable 'f'. The decoding process comes to an end once the variable 'k' reaches the value 586 (or 'nc' in the general case).

In the next step 212, the joint parity bits (JP bits) are transferred from the JIR unit 110 (see FIG. 4) to the Intermediate RAM 170 (see FIG. 4). Subsequently, for each of a successfully decoded sub code, the JP is updated with the regenerated hidden bits of the successful decoded sub-code.

In step 213, 'j' is compared with the value 586 (nc). Since at this point of the decoding process the value of 'j' is less than 586 ('j=0'), the decoding process continues to step 214.

In step 214 the disjoint word-0 (i.e. word-j in the next application of the loop) transferred from the DJIR unit 200 (see FIG. 4) is decoded in the Dual Mode Decoder 130 (see FIG. 4) in mode-1 (i.e. single error correction mode is activated with respect to Example-case 2).

In the next step 215, the State Machine unit 138 (see FIG. 5) checks whether the decoding of this sub-word has succeeded. In the negative case, the decoding process continues to step 216. In the affirmative case, the decoding process continues to step 219.

In step 219, the hidden bits $JP_0$ of word-0 are reconstructed by applying the encoder to the 11 successfully decoded bits of word-0 (i.e. word-j in the next application of the loop) and XORing the resulting 4 parity bits with the JP bits already stored in the Intermediate RAM 170 (see FIG. 5). The corresponding value of element v[0] is set to '1' to indicate that word-0 is successfully decoded and 'k' is incremented by 1. Following these variable setting operations, word-0 (i.e. wordy in the next application of the loop) is updated in the DJIR unit 200 (see FIG. 4) according to the correction result.

In step 221, 'j' is incremented by '1', thus enabling the decoding of the next sub-word. The decoding process then returns to step 213.

In step 213, it is determined whether the value of the variable 'j' is lower than 586.

In the negative case, the decoding process continues to step 222. In the affirmative case, the decoding process re-applies step 214, step 215 and if necessary step 216 with an incremented value for the variable 'j'.

In step 216, the value of variable 'f' is checked. In the event the number of so far failed sub-words 'f' exceeds the value '1' (with respect to Example case-2), the decoding process declares a failure and is finalized at step 217. Otherwise, the decoding process proceeds to step 220 (or to step 218 in case a soft decoder is implemented). Note that in case of a soft decoder; the value of variable 'f' may exceed the value of '1' before a decoding failure for the entire page sector is declared.

In step 218, the estimation carried out for the hidden bits of word 'j' is stored in the Intermediate RAM 170. Considering the implementation of a soft decoder, it is possible to provide new knowledge, even partial, on the hidden bits even though the soft decoder failed to decode. However, providing such estimation is not possible with respect to Example case-2. Therefore, in Example case-2 step 218 is bypassed.

In step 220, the value of the variable 'f' is incremented by 1 to indicate that the total number of so-far failed sub-words has increased. The decoding process then proceeds to step 221, wherein the value of the variable 'j' is also incremented by 1 to indicate the decoder proceeds to decode the next sub-code.

In step 222, the value of the variable 'k' is compared to the value 586. In case 'k'=586, then the decoding of all sub-words has succeeded and the decoding process is successfully finalized at step 223. Otherwise with respect to Example case-2, there can be only one sub-word that was not successfully decoded and the decoding process proceeds to step 224.

In step 224, the value of phase number 'p' is incremented by 1.

In step 225, it is checked whether the value of the variable 'p' is lower than 2) or lower than 'np' in the general case). In the negative case (i.e. 'p' is equal to or greater than 2), the entire decoding process is declared a failure and is brought to an end in step 226. However, in the affirmative case at step 227, the value of the variable 'j' is reset to '0' for re-decoding the failed sub-word. Following step 227, the decoding process continues to step 228.

In step 228, it is checked whether the value of vector 'v' at location 'j' (element v[j]) equals '0'. In the affirmative case, in the case of a soft decoder the decoding process proceeds to step 229; in the case of a hard decoder the decoding process bypasses step 229 and goes directly to step 237. However, in the negative case—the decoding process proceeds to step 235. In step 235, the value of variable 'j' is incremented by 1 and the decoding process proceeds to the next step 234. In step 234, it is checked whether the value of variable 'j' is lower than 586. In the negative case (i.e. 'j' is equal to or greater than 586), all elements have been scanned and the decoding process continues back to apply step 222. However, in the affirmative case (i.e. 'j'<586)—steps 228, 235 and 234 are repeated until a failed sub-word is found.

Note that step 229 is carried out only in case of a soft decoder. In the case of a soft decoder, the hidden bits of the failed sub-word are re-constructed using the so far updated JP bits of the successfully decoded sub-words and the estimations provided for the reconstructed hidden bits of the so far failed sub-words. Although the preferred method of the present invention provides estimation for the reconstructed hidden bits of the failed sub-words using a XOR operation, other operations may be further considered in the event of soft decoders.

In the case of a hard decoder, all other sub-words must be successfully decoded. With respect to Example case 2, the JP bits, stored in the Intermediate RAM 170, after having been updated with all the other successfully decoded sub-words, are used as the estimation for the hidden bits of the failed sub-word 'j'. The updated JP bits are only used for the estimation for the hidden bits of the failed sub-word 'j' in case two or more errors appear in the first 11 bits of sub-word 'j'. Note that if the second attempt to decode sub-word 'j' is successful then the updated JP bits are the reconstructed hidden bits themselves and not just estimations with respect to Example case-2. This is because succeeding in the second decoding attempt means that there were exactly two errors in the 15-bit word. Moreover, because the first attempt has failed there are exactly two errors in the first 11 bits of the 15-bit word. Hence, the last 4 bits of the 15 bit word have no errors and are an exact reconstruction of the hidden bits.

In step 237, for both, the hard decoder and the soft decoder, word-'j' is read from DJIR 200 (see FIG. 4) to Dual Mode Decoder 130 (see FIG. 4). Then the joint information is read from Intermediate RAM 170 (see FIG. 4). The joint information is combined with word-'j' in Data Collector 132 (see FIG. 5) to form a modified word to be decoded in Decoder Core 134 (see FIG. 5) in the second decoding mode. With respect to Example-case 2 the combining operation is simply concatenation and the second decoding mode is the [15,7,5] block decoder. Once the modified word-'j' is located within Decoder Core 134 (see FIG. 5), State Machine 138 (see FIG. 5) initiates the decoding operation in the final stage of step 237.

In step 230, it is checked whether the second attempt for decoding word-j has succeeded. In the affirmative case, the decoding process carries out step 231. In step 231, the value of variable 'k' is incremented by 1, the value of element v[j] is set to '1', and code word-j is updated in the DJIR 200 (see FIG. 4). In the case of a soft decoder, in step 236, the fully reconstructed hidden bits of sub-word 'j' are combined with joint parity bits stored in Intermediate RAM 170 and the estimations provided for these hidden bits are removed from Intermediate RAM 170. One way to combine the fully reconstructed (due to successful decoding) hidden bits with the joint parity bits is by bit-by-bit XORing the hidden bits with the joint parity bits. Following step 231 (or step 236 in the case of a soft decoder), the decoding process proceeds to step 233. However, in the negative case (i.e. the second decoding of word-j has failed), the decoding process proceeds directly to step 233 (or to step 232 in case a soft decoder is implemented). In step 232, the updated estimations for the hidden bits of word 'j' are stored in the Intermediate RAM 170.

In step 233, the value of variable 'j' is incremented by 1 and the decoding process returns to apply the steps provided by the decoding process until a successful decoding (step 223) or a failed decoding (step 226) is declared.

Figure 8:
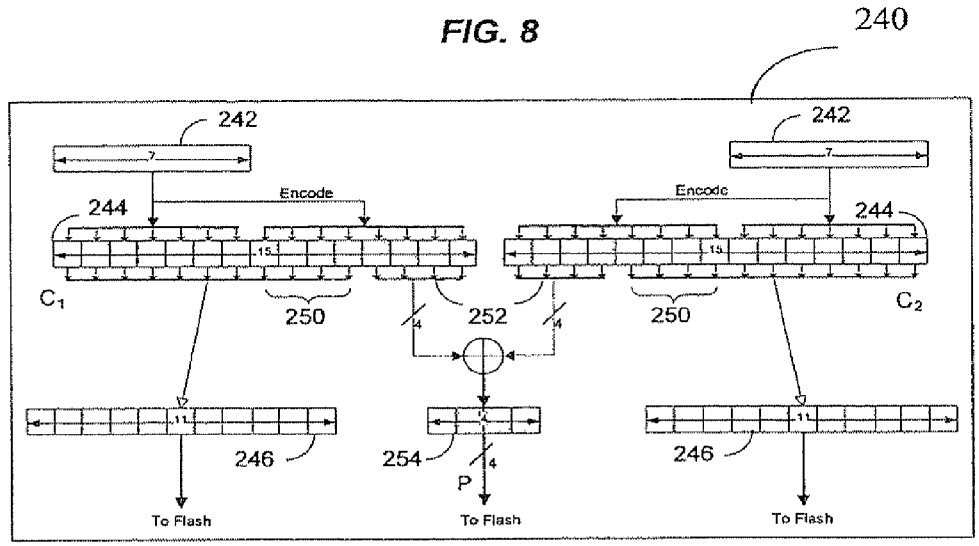
FIG. 8 is a schematic illustration of the encoding process with respect to Example case 1.

Referring to FIG. 8, there is shown a schematic illustration 240 of the encoding process, with respect to Example case 1. Each of the 7-bit information vectors, defined by numeral 242, is converted to a 15-bit code word 244, denoted as $C_1$ and $C_2$. The first 11 bits 246 of each such 15-bit code word 244 contain the 7 information bits 242 and the first 4 parity bits 250. These first 11 bits 246 are written to the flash device. The last 4 parity bits 252 of each 15 bit code word 244 are XORed together bit by bit to generate a set of 4 parity bits, defined herein as 'P' bits 254, providing a second type parity bits.

Referring to FIG. 9, there is shown a graphical illustration 260 of an input CER performance (in the x-axis) vs. an output SER performance (y-axis), with respect to Example case 2. As shown in graphical illustration 260, the SER performance obtained by the reference scheme 262 (lower line) only slightly differs from the SER performance obtained by the scheme of the present invention 264 (upper line). In the environment where SER is below $10^{-10}$ there is no practical difference in performance, although the flash memory size of the present invention is considerably smaller than the one of the reference scheme.

The implementation of a soft decoder as a component core code for the sub-codes in the device of the present invention is further possible. A soft decoder is provided for enabling the usage of component codes such as LDPC (Low-Density Parity-Check), TCM (Trellis Coded Modulation), TURBO codes, etc.

The decoding process may be carried out in several phases, while in each phase the soft decoder is activated for some sub word using updated information propagated from the other sub words through the joint information (stored in the Intermediate RAM). In the general case, the soft decoder may accept several bits including reliability bits for each value of the updated information. This means that the representation of an input bit value transferred to the soft decoder may further contain a plurality of bits (i.e. each value of the updated information is not limited to contain only a single binary value as in the above Example case 1 and Example case 2). The input bit soft value can be considered as, and converted to, probabilities that represent reliability for the binary value of input bit i to equal '0' (or conversely to equal '1').

The log likelihood ratio (LLR) defined in (2.7) below is commonly used in coding theory known in the art to represent these reliabilities for the binary value '0' or '1', according to:

$$L(b_i) \log\left[\frac{P_r(b_i = 0)}{P_r(b_i = 1)}\right] \tag{2.7}$$

in contrast to the communication domain, these probabilities are predetermined during the storage manufacturing process of a flash device. The storage unit in the flash device contains a group of bits in each cell, such that a cell voltage level corresponds to a symbol representing this group of bits. Any set of such symbols can therefore be defined as a signal constellation.

The flash device, due to its physical characteristics, can cause almost any written voltage level to be read as a different voltage level. Denote the probability of writing voltage level 'r' and reading a different level 's' as the cross over probability $P_{rs}$.

As mentioned above, due to the flash device's special manufacturing process—these probabilities are fixed given values. The input reliabilities for the binary value '0' or '1' as in (2.7) are computed using a constant given table containing these cross over probabilities $P_{rs}$.

In the first phase, the soft decoder decodes each disjoint sub-word, while the reliability of the "hidden parity bits" is set to zero (identified as erasures by the soft decoder).

Upon a success decoding, these parity bits are successfully regenerated. The transformation from a log likelihood ratio (LLR) format to a binary value format is carried out as follows:

The binary value is the sign bit of the reliability in the LLR format. In case of a successful decoding, the binary hidden values are regenerated according to the application (in the above Example case 1 and Example ease 2 this is done by the process used to encode the disjoint sub-word). Then the fully reconstructed binary hidden values are XORed bit by bit with the joint information bits read from flash device, see steps 219 and 236 of FIG. 7. As a result, the effect of the regenerated "hidden parity bit" on the joint information bits 'P' is removed. This is due to the procedure characterizing a XOR operation, in which A XOR B XOR C XOR B=A XOR C.

Note that the joint information bits stored in the flash device also include an inherent unreliability. Therefore, in case all sub words excluding one are successfully decoded, then the regeneration of the hidden bits for the failed decoded sub word using the hidden bits of the other successfully decoded sub-codes and the joint information stored in the flash device might still contain errors originated from the joint information read from the flash device.

In the event the soft decoder fails, output reliabilities are still produced in an LLR format for the "hidden parity bits". These reliabilities are stored in the Intermediate RAM. Upon completion of the first decoding phase, in case all sub-codes are decoded successfully, a successful decoding procedure is determined.

In case at least one sub-word fails in the first decoding phase, then additional decoding attempts are carried out by the soft decoder. For each such new decoding attempt the soft decoder employs updated joint information and reliabilities obtained from other failed sub-words. Such decoding attempts are supported by a "message-passing" procedure carried out between sub-words (as mentioned in the case of a soft decoder in FIG. 7, steps 229, 231, 236 and 232). The messages refer to reliabilities, which are passed between the sub-words via the Intermediate RAM.

Providing a mechanism which carries out this "message passing" procedure is in the essence of the present invention, since it is the mechanism that allows a successful decoding to overcome failed decoding events for a sub-set of the disjoint sub-word without requiring external knowledge (except the joint information). Since these reliabilities obtained in LLR format contribute new extrinsic information to a single sub-word, it might be the case that this sub-word will be successfully decoded in the next phase.

In a generic decoding phase 'p', where 'p>0', of sub-word 'y' (previously failed to decode)—the soft decoder employs the sub-word reliabilities (commonly in LLR format) of the hidden parity bits of all sub-words, excluding the contribution of the reliabilities of sub-word 'y' itself. The amplitude $A_y$ and sign value $S_y$ for the estimation of the "hidden parity bits" of sub-word 'y' at the decoding phase 'p' are derived separately for each group of "hidden parity bits" in the same position. In other words, the amplitude $A_y$ and sign value $S_y$ are computed for every hidden bit of the same sub word separately and independently from other hidden bits of the same sub-word as follows:

$$A_y = \Psi^{-1}\left\{\sum_{j \neq y, j \in F} \Psi(A_j)\right\}, \tag{2.8}$$

wherein 'F' is defined as a group containing the hidden bits of the failed decoded sub-words and external updated 'P' bits. The updated 'P' bits refer to the bits stored in the flash device updated by the regenerated hidden bits of all so far successfully decoded sub words in the decoding process. The function $\psi$ may be computed in several manners, one of which is:

$$\Psi(x) = \log\left[\left|\tanh\left(\frac{x}{2}\right)\right|\right] = \log\left[\tanh\left(\frac{|x|}{2}\right)\right], \tag{2.9}$$

Note a useful property of the function ψ: the function ψ is the negative inverse function of itself:

$$\psi[\psi(x)] = -|x| \quad (2.10)$$

The sign '$S_y$', defined herein as the sign of the reliability measured in the LLR format, is determined from applying the XOR (exclusive OR) operation on the same set 'F' participating in the computation of amplitude $A_y$ according to:

$$S_y = \mathrm{mod}\left(\left[\sum_{j \neq y, j \in F} S_j\right], 2\right), \quad (2.11)$$

wherein 'F' is defined as the group referred to above in equation (2.8).

Once the updated reliabilities for the hidden parity bits of sub-word 'y' are calculated, the same soft decoder is re-activated for decoding sub-word 'y'. The decoding and reliability updating process is repeated until a successful decoding is obtained or until a pre-defined maximal number of decoding attempts and or decoding phases are carried out by the decoding scheme.

A successful decoding process contains the steps of updating the bits of sub-word 'y' in the RAM and updating the joint information bits in the Intermediate RAM using the sign bits of the regenerated "hidden parity bits" of the successfully decoded sub-word 'y'. Accordingly, a failed decoding attempt is followed by updating the reliabilities of the hidden parity bits of sub-word 'y' in the Intermediate RAM. Although the updated reliabilities are obtained as a result of a failed decoding attempt, taking them into consideration in the decoding of other sub-words in the same phase 'p' improves the decoding efficiency of these other sub-words.

The soft decoder then proceeds to decode the next sub-word until either all sub-word are successfully decoded or until a pre-defined maximal number of decoding phases are carried out for a certain sub-code.

As described above, the Intermediate RAM stores the reliability of the "hidden bits" for each failing sub-word. However, it is further possible to configure a reduced size Intermediate RAM containing only one bit (i.e. the sign bit in the case of keeping the reliabilities in LLR format) for the estimations of the "hidden bits". In such a case, the hidden parity bits of sub-word 'y' are derived from the currently estimated hidden parity bits of the other failed sub-words and from the external updated 'P' bits. In other words, only the current estimates of the hidden parity bits of the failing sub-words (i.e., only $S_j$ for $j \in F$) are stored rather than the current estimates of the reliabilities of the hidden parity bits of the failing sub-words (i.e., both $A_j$ and $S_j$ for $j \in F$).

The innovation of the present invention can be looked at from various points of view. From a first point of view, the present invention discloses a method and device achieving a successful decoding of a long code word by decoding a shorter code word a plurality of times. With respect to Example case-1 described above, the long code word is the [15,7,5] block code and the shorter code word is the (11,7,31 block code. The shorter [11,7,3] block code is decoded 2 times.

This enables a device of the present invention to avoid the high implementation complexity associated with decoders known in the art, while achieving the same output BER/SER performance.

According to this first point of view, it may be argued that every decoding method known in the art provided for decoding a stream of data by successively decoding a fixed-size sub-word is implemented in a similar manner as the present invention.

For example, it is required to decode a stream of data, wherein each code word is of 1,000 bits and each such code word is decoded on its own, independently of the code words preceding it or following it. According to decoding methods known in the art, the stream of data are decoded as N (for example N=4) groups of code words. The entire stream of N groups is defined, for N=4, as a single long code word of 4,000 bits. A short decoding is applied separately on each of the four short code words of 1,000 each, such that the decoded data of all short decoding are concatenated to generate the decoded data of the long code word.

However, the method of the present invention provides an error correction coding scheme which differs from the existing decoding methods mentioned above, because the method of the present invention further provides a stage of modifying the decoded data of a short code word according to the decoded data of other short code words in case the decoding of the short code word fails. With relation to Example case-1 described above, the hidden bits of the decoded data of the failed short code word are replaced according to the reconstructed hidden bits of the decoded data of the other successfully decoded short code word and the joint parity (JP) bits stored in the FLASH device.

This stage, which is completely lacking in the above prior art methods, grants the present invention many of its advantages. One such advantage is overcoming a decoding failure in one or more short words, hence requiring fewer parity bits to protect those shorter code words.

An additional decoding method known in the art is based on a connection between the different short code words. According to this method, commonly referred to as a concatenated coding scheme, a few short code words encoded by a first code are grouped together and encoded again by a second code to generate a long code word. Such prior art methods affect modifications of the still-encoded short code words according to the decoding of the longer code word, and only then decode the short code words.

For example, a stream of data of four code words (including 4,000 bits), wherein each basic code word is of 1,000 bits, is encoded by a first code as one long code word of 4,500 bits. The decoding of the long code word requires first decoding the long word according to the second code, and then decoding each short code word separately according to the first code.

However, with relation to Example case-1 the method of the present invention differs from such prior art methods, since the method of the present invention first decodes the short code words and then effects modifications of the decoded data according to the decoded data of other short code words.

Other decoding methods, referred to as Turbo decoding, employ a "Turbo code", which typically utilizes a soft decoding method. A "Turbo code" is defined as a forward-error correction technique made up of a concatenated code structure plus an iterative feedback algorithm. By applying Turbo decoding the same data bits are encoded twice or more (with the data bits interleaved to have a different order in the multiple encoding operations), such that the code word contains both the data bits and the multiple sets of parity bits generated by all encodings. On decoding, multiple decoding processes are applied (in parallel or not). Each decoding process, applied according to one of the multiple sets of parity bits, accepts extrinsic information from the previous decoding phase on the same information data but with different parity bits.

The advantage of the forward-error correction technique lies in the interaction ("message passing") between the multiple decoding processes applied for decoding the same data bits. This interaction enhances the error correction performance of the decoder. A decoder applying Turbo decoding may further be configured to decode the data according to only one set of parity bits, such that only in the case of a failed decoding the multiple sets of parity bits are decoded as described above.

The method of the present invention differs from Turbo decoding methods known in the art in a few aspects. Firstly, there is a clear separation between the decoding of a sub-word itself and the procedure of effecting modifications of decoded words. The method of the present invention separately decodes each of the short words and only then applies the process in which one part of the decoded data affects another part. However, according to the Turbo decoding method, there is no such clear separation between decoding a sub-word and effecting modifications of other sub-words—both procedures occur simultaneously.

Secondly, according to the method of the present invention, each short word is decoded independently of the other short words. Thus, the decoded code words generate an independent set of decoded data. However, according to the Turbo decoding method, either all of the short words (in the typical parallel implementation) or at least one short word (in the two-stage implementation) are decoded in tandem with another short code word to generate a joint set of decoded bits. Furthermore, a decoded short code word is not necessarily identified as an "own decoded data" (i.e. is dependent on other code words).

Thirdly, according to the present invention, the multiple short code words are disjoint subsets of the long code word. However, such implementation is not provided in Turbo decoding methods, wherein multiple short code words all encode the same data bits.

From a second point of view, the innovation of the present invention is improving error correction performance by encoding data bits using two encoding schemes, not keeping all of the resulting parity bits, and relying on the relation between the two sets of parity bits to make one set "cover up" for cases of inadequacy of the other set. When viewing the invention from this point of view, the following aspects should be taken into account.

a. The distinguishing feature of this point of view is the intermediate stage of calculating more parity bits than are eventually used. This draws one's attention to the prior art method of "puncturing". In error correction theory terminology "puncturing" means dropping some calculated parity bits in order to reduce the parity overhead, trading the reduced overhead against lower error correction capability. However, "puncturing" as understood in the prior art is very different from the present invention—the present invention employs two error correction encoding schemes as a basis for its operation, while nothing of the sort exists in the prior art puncturing methods which use only a single encoding scheme.

b. U.S. patent application Ser. No. 10/998,003 to Dror et al. filed at Nov. 29, 2004, published as US Patent Application Publication No. 2005/0160350 and entitled "COMPACT HIGH-SPEED SINGLE-BIT ERROR-CORRECTION CIRCUIT", discloses an error correction method that also drops some of the parity information computed during the encoding phase. The method of Dror et al. is closer to the present invention than the puncturing method discussed above, because the method of Dror et al. includes two separate computation phases where parity information is dropped from the results of only one of the phases, seemingly like in the present invention. However, Dror et al. is different from the present invention because of the same fact stated above—the present invention employs two error correction encoding schemes, while this is not the case in Dror et al. Even though Dror et al. does two computation phases, each phase is not an error correction scheme as it cannot correct even a single error on its own. Only the two computations together provide enough parity information for correcting errors, and therefore only the two computations together constitute an error correction scheme.

It is to be understood that although the present invention relates to systematic codes, the method of the present invention is equally applicable to both systematic and non-systematic error correction codes. According to error correction terminology, a systematic code is defined as a code in which each of the input data bits transferred to the encoder have a one-to-one correspondence to a matching bit in the encoded code word, before puncturing if applicable, such that encoded code word bits can be divided to two disjoint portions—one including the original data bits and the other including parity bits. Accordingly, a non-systematic code is defined as any code that does not satisfy the above condition (i.e. such clear division is not possible in a non-systematic code).

The method of the present invention is equally applicable to both hard-decoding and soft-decoding decoders. According to error correction terminology, a soft-decoding decoder applies a decoding process that is capable of accepting reliability measures for the input bits, taking them into consideration during the decoding process, and updating the reliability measures during the process. A hard-decoding decoder is a decoder that does not satisfy the above condition.

Although the present invention, as described above, is based on a simple BCH code, other coding and decoding techniques known in the art achieving a similar efficiency and performance gain may be employed.

Furthermore, the code structure employed by a device of the present invention may be employed in any such device known in the art, including digital storage media, random access memory, flash memory, and EEPROM. The terms "storage" and "memory" are used herein interchangeably and refer to any such storage devices.

It should be noted that while the present invention is provided herein to flash memory, the principles of the present invention may be adapted for use in, and provide benefit for other types of applications, such as communications systems (wireless, wire line, wired telephone systems, satellite, cellular, including DSL, DVBS, 3G, 4G, CDMA2000, the derivations of 802.11 and 802.16, etc) and signal processing (Video and voice applications).

In case the first phase of the decoding process is insufficient, a buffer may be further implemented in communication systems known in the art, in order to keep the data for an occasional activation of further decoding attempts. However, it may be the case that no additional buffer is required, since such a buffer may already be employed in other parts of the communication system while the decoding units are idle.

It can be understood that other implementations are possible within the scope of the invention, thus relating to any method and device providing an error correction coding scheme.

Having described the invention with regard to a certain specific embodiment thereof, it is to be understood that the description is not meant as a limitation, since further modifications will now suggest themselves to those skilled in the art, and it is intended to cover such modifications as fall within the scope of the appended claims.

REFERENCES

[1] Shannon, "A mathematical theory of communications" Bell System Telephone Journal, Vol. 27, 1948, pt. I, pp. 379-423; pt. II pp. 623-656.

[2] M. G. Luby, M. Mitzenmacher, M. A. Shokrollahi and D. A. Spielman, "Improved low density parity-check codes using irregular graphs and belief propagation," *Proc. of the IEEE Int. Symp. on Inf. Theory (ISIT)*, p. 117, 1998.

[3] R. G. Gallager, "Low-density parity-check codes," *IRE Trans. Info. Theory*, vol. IT-8, pp. 21-28, 1962.

[4] T. J. Richardson and R. Urbanke, "The capacity of low-density parity-check codes under message passing decoding," *IEEE Trans. Inform. Theory*, vol. 47, pp. 599-618, 2001.

[5] C. Berron, A. Glavieux, and P. Thitimajshima, "Near Shannon limit error correcting coding and decoding: Turbo codes," in IEEE Int. Conf. on Communications, 1993, pp. 1064-1070.

[6] M. M. Mansour and N. R. Shanbhag, "High-Throughput LDPC de-coders," *IEEE Trans. on Very Large Scale Integration Systems*, vol. 11, pp. 976-995, 2003.

[7] T. J. Richardson, A. Shokrollahi and R. Urbanke, "Design of capacity approaching low-density parity-check codes," *IEEE Trans. Inform. Theory*, vol. 47, pp. 619{637, 2001.

[8] E. Sharon, S. Litsyn, J. Goldberger "An Efficient Message-Passing Schedule for LDPC Decoding," in proc. 23rd IEEE Convention in Tel-Aviv, Israel, pp. 223-226, Sep. 6-7, 2004.

[9] R. M. Tanner, "A recursive approach to low complexity code" *IEEE Trans. on Info. Theory*, vol. 27(5), pp. 533-547, 1981.

[10] J. Zhang and M. Fossorier, "Scheduled belief propagation decoding," *The Proceedings 36th Asilomar Conference on Signals, Systems and Computers*, Pacific Grove, USA, vol. 1, pp. 8-15, 2002.

[11] Dale E. Hocevar, "Efficient encoder for low-density-parity-check-codes", Texas instruments incorporated. US Patent application publication No. 2004/0148560, Jul. 29, 2004

[12] Mustafa Eroz, Feng-Wen Sun, Lin-Nan Lee, "Method and apparatus for providing reduced memory low density parity check codes". The direct TV group, INC., US Patent Application Publication No. 2005/0091565 A1, Apr. 28, 2005

[13] Mustafa Eroz, Feng-Wen Sun, Lin-Nan Lee, "Method and system for providing long and short block length low density parity check codes". The direct TV group, INC., US Patent Application Publication No. 2005/0091570 A1, Apr. 28, 2005

[14] Mustafa Eroz, Feng-Wen Sun, Lin-Nan Lee, "Encoding low density parity check codes through an LDPC decoder". The direct TV group, INC., US Patent Application Publication No. 2005/0003756 A1, Jan. 6, 2005

[15] Richardson, et al. "Methods and apparatus for decoding LDPC codes", U.S. Pat. No. 6,633,856, Finks Technologies, Inc. (Bedminister, N.J.), Oct. 14, 2003.

[16] Error-correcting codes, second edition, W. Wesley Peterson, E. J. Weldon.

[17] Elwyn R. Berlekamp/Algebraic Coding Theory, Revised 1984 Edition.

[18] Error-Correcting Codes and Finite Fields/Oliver Pretzel

[19] R. E. Blahut, Theory and Practice of Error-Correcting codes, Addison-Wesley, 1983.

[20] W. G. Chambers, R. E. Peile, K. Y. Tsie, and N. Zein, An algorithm for solving the Welch-Berlekamp key-equation with a simplified proof, Electronic Letters, vol. 29, 1993, pp. 1620-1621.

[21] V. Guruswami and M. Sudan, Improved decoding of Reed-Solomon and Algebraic-Geometry codes, IEEE Trans. Inform. Theory, 6, 1999, pp. 1757-1767.

[22] D. Mandelbaum, Decoding of erasures and errors for certain RS codes by decreased redundancy, IEEE Trans. Inform. Theory, vol. 28, 2, 1982, pp. 330-336.

[23] J. L. Massey, Shift-register synthesis and BCH decoding, IEEE Trans. Inform. Theory, vol. 15, 1969, pp. 122-127.

[24] W. Peterson, and W. Weldon, Error Correcting Codes, 1974.

[25] L. Welch and E. R. Berlekamp, Error correction for algebraic block codes, U.S. Pat. No. 4,633,470, 1983.

What is claimed is:

1. A method of decoding a representation of a code word that has been read from a storage device, the representation containing a plurality of data bits and a plurality of parity bits, the method comprising the steps of: in a decoder:
    (a) partitioning the parity bits into a first group of parity bits and a second group of parity bits;
    (b) decoding the data bits using only said first group of parity bits to provide corrected data bits; and
    (c) if said decoding using only said first group of parity bits fails, then decoding the data bits using said first group of parity bits and said second group of parity bits to provide said corrected data bits.

2. A method of decoding a representation of a code word that has been read from a storage device the representation containing a plurality of data bits and a plurality of parity bits, the method comprising the steps of: in a decoder:
    (a) partitioning the data bits into a plurality of subsets, wherein each of the data bits appears at least once in said subsets;
    (b) partitioning the parity bits into a first group of parity bits and a second group of parity bits;
    (c) partitioning said first group of parity bits into a plurality of subsets equal in number to said plurality of subsets of the data bits, with each said subset of said first group of parity bits corresponding to a respective subset of the data bits;
    (d) decoding each said subset of the data bits according to said corresponding subset of said first group of parity bits to generate decoded data of said each subset of the data bits;
    (e) if said decoding of one of said subsets of the data bits fails: decoding said one subset according to, at least in part, said second group of parity bits to generate said decoded data of said one subset; and
    (f) combining said decoded data of all of said subsets of the data bits to generate total decoded data for the data bits.

3. The method of claim 2, wherein said combining of said decoded data of all said subsets of the data bits is effected by assembling said decoded data of all said subsets of the data bits.

4. The method of claim 2, wherein said subsets of the data bits are disjoint.

5. The method of claim 2, wherein said subsets of the data bits are all of equal size.

6. The method of claim 2, wherein said decoding of the data bits of said each subset according to said corresponding subset of said first group of parity bits includes using a corresponding first decoding scheme, and wherein said decoding of the data bits of said one subset, whose decoding failed, according to said second group of parity bits includes using a corresponding second decoding scheme.

7. The method of claim 6, wherein for at least one of said subsets of the data bits said corresponding first decoding scheme and said corresponding second decoding scheme apply a common decoding method.

8. The method of claim 6, wherein all said first decoding schemes are identical.

9. The method of claim 6, wherein all said second decoding schemes are identical.

10. A method of decoding a number M of data bits out of a representation of a code word, that has been read from a storage device and that has a number N greater than M of bits, the method comprising the steps of: in a decoder:
   (a) removing a selected subset of at most N−M bits from the N bits, thereby producing a set of remaining bits;
   (b) partitioning said remaining bits into a plurality of subsets of said remaining bits, wherein each of said remaining bits is a member of at least one of said subsets;
   (c) decoding each of said subsets according only to bits of said each subset to generate decoded data of said each subset;
   (d) if said decoding of one of said subsets fails: decoding said one subset, at least in part, according to said removed selected subset to generate said decoded data of said one subset; and
   (e) combining said decoded data of all of said subsets to generate total decoded data for the M data bits.

11. The method of claim 10, wherein said combing of said decoded data of all said subsets is effected by assembling all of said decoded data of all said subsets.

12. The method of claim 10, wherein said subsets are disjoint.

13. The method of claim 10, wherein said subsets are all of equal size.

14. The method of claim 10, wherein said decoding of the data bits of said each subset according to said bits of said each subset includes using a corresponding first decoding scheme, and wherein said decoding of the data bits of said one subset whose decoding failed according to said removed selected subset includes using a corresponding second decoding scheme.

15. The method of claim 14, wherein for at least one of said subsets said corresponding first decoding scheme and said corresponding second decoding scheme apply a common decoding method.

16. The method of claim 14, wherein all said first decoding schemes are identical.

17. The method of claim 14, wherein all said second decoding schemes are identical.

18. A method of decoding a representation, of a code word, that has been read from a storage device, the method comprising the steps of: in a decoder:
   (a) generating a plurality of sub-words from the representation of the code word, such that bits of each said sub-word are a proper subset of bits of the representation of the code word;
   (b) decoding each said sub-word solely according to its own bits to generate a corresponding decoded sub-word; and
   (c) if said decoding of one of said sub-words fails: modifying said decoded sub-word that corresponds to said one sub-word whose decoding failed, thereby producing a modified decoded sub-word, said modifying being at least in part according to said corresponding decoded sub-word of at least one successfully-decoded sub-word.

19. The method of claim 18 further comprising the step of
   (d) if said decoding of one of said sub-words fails:
   combining data from said modified decoded sub-word with data from said corresponding decoded sub-words of all of said successfully-decoded sub-words.

20. The method of claim 19, wherein said combining of data from said modified decoded sub-word with data from said corresponding decoded sub-words of all of said successfully-decoded sub-words is effected by steps including assembling said data from said modified decoded sub-word with said data from said corresponding decoded sub-words of all of said successfully-decoded sub-words.

21. The method of claim 18, wherein said sub-words are disjoint.

22. The method of claim 18, wherein said sub-words contain identical numbers of bits.

23. An apparatus for decoding a word that includes a number M of bits, comprising:
   (a) a decoder for decoding a word that includes a number N less than M of bits; and
   (b) a mechanism for applying said decoder separately to each of a different subset of N bits selected from the word of M bits, each application of said decoder depending solely on said N bits to which each said application is applied, each said application generating corresponding decoded data, such that final decoded data of the word of M bits are generated at least in part according to said corresponding decoded data of said applications, wherein: if one of said applications fails, then said mechanism effects a modification of said corresponding decoded data of said failed application, at least in part, according to said corresponding decoded data of at least one successful application.

24. The apparatus of claim 23, wherein said subsets are disjoint.

25. An apparatus for decoding a word that includes a number M of bits, comprising:
   (a) a plurality of decoders each decoding a word that includes a number N less than M of if bits; and
   (b) a mechanism for applying each of said plurality of decoders separately to each of a different subset of N bits selected from the word of M bits, each application of each of said plurality of decoders depending solely on said N bits to which each said application is applied, each said application generating corresponding decoded data, such that final decoded data of the word of M bits are generated at least in part according to said corresponding decoded data of said applications, wherein: if one of said decoders fails, then said mechanism effects a modification of said corresponding decoded data of said decoder that failed, at least in part, according to said corresponding decoded data of at least one said decoder that succeeded.

26. The apparatus of claim 25, wherein said subsets are disjoint.

* * * * *